(12) United States Patent
Hindle et al.

(10) Patent No.: US 10,031,187 B2
(45) Date of Patent: Jul. 24, 2018

(54) SYSTEM AND METHOD FOR MONITORING A DC POWER SYSTEM

(71) Applicant: Hindle Power, Inc., Easton, PA (US)

(72) Inventors: William A. Hindle, Everittstown, NJ (US); Nicholas C. Hindle, Clinton, NJ (US); Robert Beck, Allentown, PA (US); Larry S. Meisner, East Norriton, PA (US)

(73) Assignee: Hindle Power, Inc., Easton, PA (US)

( * ) Notice: Subject to any disclaimer, the term of this patent is extended or adjusted under 35 U.S.C. 154(b) by 0 days.

(21) Appl. No.: 15/316,213

(22) PCT Filed: May 10, 2016

(86) PCT No.: PCT/US2016/031636
§ 371 (c)(1),
(2) Date: Dec. 5, 2016

(87) PCT Pub. No.: WO2016/183076
PCT Pub. Date: Nov. 17, 2016

(65) Prior Publication Data
US 2017/0199246 A1 Jul. 13, 2017

Related U.S. Application Data

(60) Provisional application No. 62/159,654, filed on May 11, 2015.

(51) Int. Cl.
G01N 27/27 (2006.01)
G01R 31/36 (2006.01)
H01M 10/42 (2006.01)
H01M 10/46 (2006.01)
H02J 7/00 (2006.01)

(52) U.S. Cl.
CPC ..... G01R 31/3631 (2013.01); G01R 31/3658 (2013.01); H01M 10/4285 (2013.01); H01M 10/46 (2013.01); H02J 7/0026 (2013.01)

(58) Field of Classification Search
CPC .............. G01R 31/3631; G01R 31/3658; H01M 10/46
USPC .......................................... 324/434
See application file for complete search history.

(56) References Cited

U.S. PATENT DOCUMENTS

| 8,558,508 B2* | 10/2013 | Fechalos | G01R 31/3606 320/132 |
| 2009/0289635 A1 | 11/2009 | Coccio | |
| 2010/0271006 A1 | 10/2010 | Fortner | |

(Continued)

FOREIGN PATENT DOCUMENTS

WO 2011115640 A1 9/2011

OTHER PUBLICATIONS

Korean International Search Report and Written Opinion of the International Searching Authority, dated Aug. 24, 2016, for PCT/US2016/031636.

*Primary Examiner* — Reena Aurora
(74) *Attorney, Agent, or Firm* — Design IP

(57) ABSTRACT

The present application discloses an integrated direct current (DC) subsystem monitoring system for monitoring and reporting status of a utility substation, the DC subsystem monitoring system having the ability to actively monitor and report on changes in the float current and current capacity of the system, as well as to monitor for ground faults.

9 Claims, 12 Drawing Sheets

(56) References Cited

U.S. PATENT DOCUMENTS

2011/0187377 A1    8/2011    Boysen et al.
2014/0117997 A1    5/2014    Bertness

* cited by examiner

SYSTEM AND METHOD FOR MONITORING A DC POWER SYSTEM

BACKGROUND

The North American Electric Reliability Corporation (NERC) promulgates standards directed to maintaining the reliability of the electric power grid infrastructure. For example, NERC standard PRC-005-2, which is incorporated herein by reference, sets forth required testing timelines for testing direct current (DC) systems of a power utility, for example DC relay systems located at a power utility substation. Such DC relay systems often include a backup service battery system. Such a backup service battery system is often, but not necessarily, a stationary system having a battery charger that maintains the battery fully charged and supplies power to the DC load under normal operation. In the event that supply power is lost to the battery charger, the backup service system switches to battery power to supply uninterrupted power to the DC load. Thus, the DC relays at a power substation might maintain power to provide power switching in the event of an emergency condition, such as a blackout or brownout. The batteries employed in such systems are typically either vented lead acid (VLA) batteries or Valve-Regulated Lead Acid (VRLA) batteries. The Institute of Electrical and Electronics Engineers (IEEE) has promulgated a standard for battery integrity testing, IEEE 450-2010, which is incorporated herein by reference, that provides standard procedures for maintenance and testing procedures to optimize the life and performance of permanently installed VLA storage batteries used for backup service, for example as backup power to DC relays in power switching applications at a power utility substation.

NERC PRC-005-2 requires that specified tests be performed at specified time intervals. For example, under NERC PRC-005-2, every four calendar months the utility must verify the DC supply voltage of the battery system, inspect electrolyte level of the batteries, and check for ground faults. Every 18 calendar months, the utility must verify the float voltage of the battery charger, the continuity of all battery cells, battery terminal connection resistance, battery inter-cell or unit-to-unit connection resistance and visually inspect the batteries. Finally, every six calendar years, the utility must verify battery performance by conducting a capacity test of the entire battery bank. However, to currently perform such tests, a technician must visit each physical substation location, and typically perform tests by manually connecting test equipment to the system. This can be both dangerous to the technician and time-consuming. Further, many substations, especially geographically remote substations and/or older substations do not support much, if any, data communication between the substation and a central control facility. For example, the oldest and/or most remote substations might not have any data communication with a central control facility. Slightly more modern substations might only support one or more contact closure connections that might only communicate data in one direction (e.g., from the substation to a central control), and might not provide much information beyond informing the utility to send a technician to manually diagnose an issue. More recently, utility companies having been employing Supervisory Control and Data Acquisition (SCADA) systems in new substations to communicate data between the substation and a central control facility, that might acquire, aggregate and communicate data from the substation to a central control facility. However, the types of data supplied in current SCADA systems is limited, and the performance of tests in accordance with either NERC PRC-005-2 or IEEE 450-2010 still require a technician be physically present to manually perform tests.

Thus, improved systems are needed to remotely test and monitor the status of the backup service system and batteries, and report the test results and system status to a remote location, while providing backward compatibility to older utility infrastructure.

BRIEF DESCRIPTION OF THE DRAWING FIGURES

Other aspects, features, and advantages of described embodiments will become more fully apparent from the following detailed description, the appended claims, and the accompanying drawings in which like reference numerals identify similar or identical elements.

DETAILED DESCRIPTION

Figure 1:
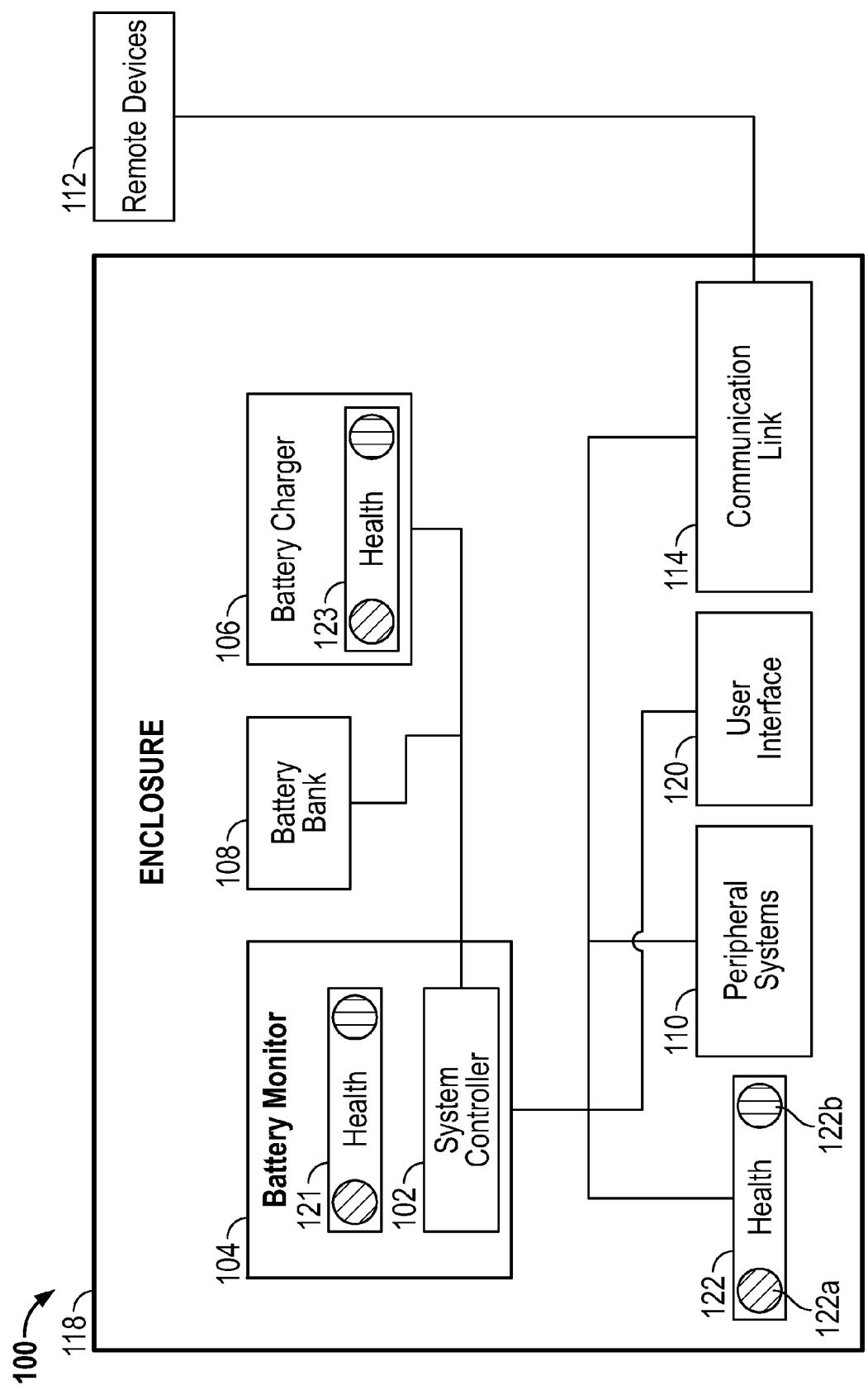
FIG. 1 shows a block diagram of a battery backup monitoring system in accordance with described embodiments.

The ensuing detailed description provides example embodiments only, and is not intended to limit the scope, applicability, or configuration of the claims. Rather, the ensuing detailed description of provides those skilled in the art with an enabling description for implementing the described embodiments. Various changes might be made in the function and arrangement of described elements without departing from the spirit and scope of the appended claims.

Directional terms may be used in this specification and claims to describe portions of the present invention (e.g., upper, lower, left, right, etc.). These directional terms are merely intended to assist in describing the embodiments, and are not intended to limit the scope of the claims. In addition, reference numerals that are introduced in the specification in association with a drawing figure may be repeated in one or more subsequent figures without additional description in the specification in order to provide context for other features.

Reference herein to "one embodiment" or "an embodiment" means that a particular feature, structure, or characteristic described in connection with the embodiment can be included in at least one embodiment. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

While the embodiments have been described with respect to processing blocks in a software program, including possible implementation as a digital signal processor, microcontroller, or general-purpose computer, described embodiments are not so limited. As would be apparent to one skilled in the art, various functions of software might also be implemented as processes of circuits. Such circuits might be employed in, for example, a single integrated circuit, a multi-chip module, a single card, or a multi-card circuit pack.

Described embodiments might also be embodied in the form of methods and apparatuses for practicing those methods. Described embodiments might also be embodied in the form of program code embodied in non-transitory tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing described embodiments. Described embodiments might also be embodied in the form of program code, for example, whether stored in a non-transitory machine-readable storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the described embodiments. When implemented on a general-purpose processor, the program code segments combine with the processor to provide a unique device that operates analogously to specific logic circuits. Described embodiments might also be embodied in the form of a bitstream or other sequence of signal values electrically or optically transmitted through a medium, stored magnetic-field variations in a magnetic recording medium, etc., generated using a method and/or an apparatus of the described embodiments.

It should be understood that the steps of the methods set forth herein are not necessarily required to be performed in the order described, and the order of the steps of such methods should be understood to be presented as examples. Likewise, additional steps might be included in such methods, and certain steps might be omitted or combined, in methods consistent with various described embodiments.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard. Unless explicitly stated otherwise, each numerical value and range should be interpreted as being approximate as if the word "about" or "approximately" preceded the value of the value or range.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports might be referred to by the same name and are interchangeable for purposes here.

Described embodiments provide an integrated monitoring system to monitor the status of the direct current (DC) subsystem of a utility substation. In particular, described embodiments provide a system that aggregates data from one or more modules within the DC subsystem and reports the aggregated data to one or more remote devices. For example, the modules might include a battery charger of the DC subsystem, the batteries of the DC subsystem, relays of the DC subsystem, and other peripheral systems, such as heating, cooling, ventilation, or other peripheral systems. The integrated monitoring system might aggregate data from each module into a single indication of overall system status. The aggregated system status might be displayed locally on a user interface of the integrated monitoring system, for example a simple status indication light indicating that the system status is operational, that the system has one or more warnings or that the system has one or more critical issues (e.g., a green indicator light indicating that the system is normal, a solid red light indicating an error/warning, and a flashing red indicator light indicating a critical error/warning). Further, the aggregated system status might also be reported to one or more remote locations. Further, the integrated monitoring system might report the data collected from each of the modules within the DC subsystem to the remote location for monitoring and analysis, and this detailed data might also be displayed locally on a user interface of the integrated monitoring system. The detailed status data might show, for example, detailed data of each module of the DC subsystem, plus any warnings or errors, and also suggested solutions for any warnings or errors. For example, the detailed status might be displayed on an LCD screen, computer monitor or touchscreen of the integrated monitoring system. Thus, described embodiments provide an improved monitoring and reporting system for DC subsystems of utility substations.

Table 1 defines a list of acronyms employed throughout this specification as an aid to understanding the described embodiments.

TABLE 1

| $A_{Battery}$ | Amperage of battery | $T_{start}$ | An average temperature of 10% of the battery's cells prior to the start of a capacity test, manually taken |
|---|---|---|---|
| C1 | Test Contact | $T_{TimeConversion}$ | Temperature time conversion factor, calculated with table |
| C2 | Set to record information on graph | $V_{flow}$ | Float voltage low range |

TABLE 1-continued

| | | | |
|---|---|---|---|
| FC1 | Float current limit | $V_{fhigh}$ | Float voltage high range |
| Vf | Float voltage range | $N_{cells}$ | Number of cells in battery string |
| Vb | Battery Voltage | $D_{time}$ | Discharge time at rated test load |
| Vc | Charger voltage | $D_V$ | Discharged voltage |
| Vs | Battery voltage 1 second before measurement period | $V_{setpoint}$ | Charger low voltage set point |
| TD1 | Float voltage test timer | Vec | The voltage at which the cell is completely discharged |
| FC1 | Float current measurement shunt | TD1 | A system timer that counts the hours since the last battery discharge |
| FC2 | Recording of float current | TD2 | A timer that counts the length of the capacity test |
| M | Temperature compensation multiplier | $T_{battery}$ | The temperature of the battery measured by a thermistor |
| FCt | Temperature compensated float current measurement | P | Percentage of life reduced at daily average temperature |
| B | Baseline float current | $L_T$ | Rated/Recommended battery temperature (typically 25 degrees Celsius) |
| C3 | Float current alarm | $L_r$ | Life remaining |
| $D_a$ | Daily average temperature in Celsius | | |

FIG. 1 shows a block diagram of an integrated battery backup monitoring system 100 that monitors, collects and reports data regarding the function of a battery backup system, for example a battery backup system for a power substation (not shown). The integrated battery backup monitoring system 100 includes the system controller 102 and each of the various DC subsystem modules, such as the battery monitor 104, the battery charger 106, the battery bank 108, the peripheral systems 110, the remote devices 112, and the communication link 114. The battery monitor 104 is also referred to herein as a "test box" or "battery tester".

In general, the integrated battery backup monitoring system 100 might be installed at a power substation in one or more physical enclosures 118. In some embodiments, system controller 102 is a Supervisory Control and Data Acquisition (SCADA) device such as a computer or a programmable logic controller (PLC). The integrated battery backup monitoring system 100 also includes user interface 120, which might typically include input/output devices such as an LCD screen, a touchscreen, a keyboard, push buttons, selector switches, or other similar user interface devices. The user interface 120 is located with the one or more enclosures 118, and can be accessed by a technician evaluating the status of, or changing the settings of, the battery backup system. Any of the DC subsystem modules could be located within the one of the enclosures 118. The integrated battery backup monitoring system 100 also includes aggregate system status indicator 122, which is preferably located on an external surface of one of the enclosures 118, and provides a quick visual indicator of the status of the battery backup monitoring system 100. For example, some embodiments might provide one or more indicator lamps to indicate the aggregate system status. In one embodiment, a red indicator lamp 122b glowing solid red indicates a warning condition of the battery backup monitoring system 100, the red indicator lamp 122b flashing indicates an error/failure condition, and a green indicator lamp 122a glowing solid green indicates a normal operating condition of the battery backup monitoring system 100. The battery backup monitoring system 100 is utilized to power a DC work load, for example one or more DC relays (not shown) that route power within and/or external to the substation.

Remote device 112 might be implemented as a server, a desktop computer, a laptop computer, or a mobile device, such as a smartphone or tablet. In general, the remote device might be located at a main service office of the utility. Communication link 114 between the integrated battery backup monitoring system 100 and the remote device 112 might include wired and wireless communications systems, for example, a contact closure interface, a Local Area Network (LAN), a Wide Area Network (WAN), a satellite communications network, or a telephony network such as a cellular network or a circuit switched network such as one of the following: LTE, WiMAX, UMTS, CDMA2000, GSM, cell relay (ATM), packet switched (X.25, Frame-Relay), Circuit switched (PPP, ISDN), link, or any other similar interface link for communicating between devices. The connections between the system controller 102 and each of the various DC subsystem modules, such as the battery monitor 104, the battery charger 106, the battery bank 108, and the peripheral systems 110 might be implemented as any of the networks of communication link 114, or alternative network types such as a Personal Area Network (PAN), a Wireless Personal Area Network (WPAN), IrDA, Wireless USB, Bluetooth, Z-Wave, Zigbee, Small Computer System Interface ("SCSI"), Serial Attached SCSI ("SAS"), Serial Advanced Technology Attachment ("SATA"), Universal Serial Bus ("USB"), an Ethernet link, an IEEE 802.11 link, an IEEE 802.15 link, an IEEE 802.16 link, a Peripheral Component Interconnect Express ("PCI-E") link, a Serial Rapid I/O ("SRIO") link, or any other similar interface link for communicating between devices. In some embodiments, data communications over communication link 114 is encrypted to prevent unauthorized access.

In embodiments of the integrated battery backup monitoring system 100 that include a battery monitor 104, the battery monitor 104 might perform testing in accordance with the IEEE 450 standard, for example, float current tests, battery capacity tests, ground fault tests, and battery life tests. These test results might be communicated to system controller 102 over communication link 114 to update the user interface 120 and aggregate system status indicator 122, as well as transmit test result data to remote device 112. Test results might be employed to generate warning indications and/or error indications. Warning indications might generally be employed to notify a user of the system to investigate fixing a non-critical condition of the system, for example if operating conditions of the system are only slightly outside of expected normal operating conditions, if a battery age is nearing a predetermined threshold, or other non-fatal conditions. Error indications might generally be employed to alter system operating conditions as well as notify the user of a critical failure condition. For example, an error condition might be employed by system controller 102 to initiate operation of a ventilation system if a measured amount of hydrogen exceeds a safety threshold. Similarly, other peripheral systems, such as a pumping system, cooling system, heating system or fire suppression system might be enabled or disabled based on error indications and measured operating conditions.

Figure 2:
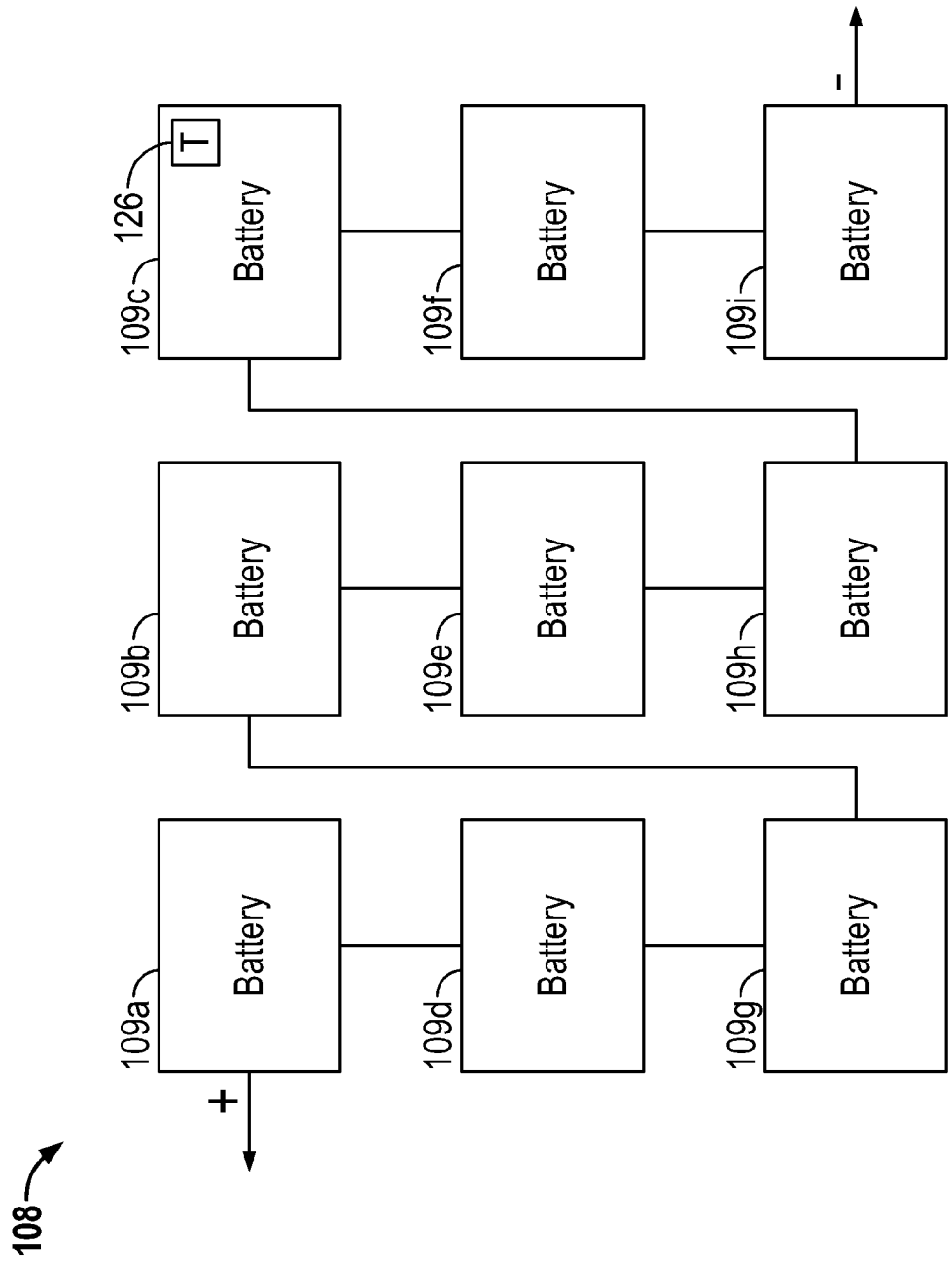
FIG. 2 shows greater detail of a battery bank of the system of FIG. 1.

FIG. 2 shows greater detail of battery bank 108. As described herein, some embodiments of the integrated battery backup monitoring system 100 might monitor test and measurement data from one or more modules within the DC subsystem, such as a battery monitor 104, battery charger 106, battery bank 108, and other peripheral systems 110, such as heating, cooling, ventilation, pumping, security, fire suppression, or other peripheral systems. In embodiments that monitor the battery bank 108, one or more temperature sensors 126 might monitor the temperature of one or more of the batteries 109a-109i that comprise the battery bank 108. In this embodiment, the batteries 109a-109i are vented lead acid (VLA) batteries, but other types of batteries could be used, such as valve-regulated lead acid (VRLA) batteries, or other batteries having other chemistries, such as nickel cadmium (Ni-Cd) or Lithium Ion (Li-Ion) batteries. In order to simply FIG. 2, a single connection is shown between each of the batteries 109a-109i. It should be understood that there is a both positive and negative electrical connection between each battery, resulting in the batteries 109a-109i being connected in series. It would be possible to have multiple battery banks 108 and/or some of the batteries 109a-109i connected in parallel. VLA batteries might generate hydrogen as a by-product of their operation, which, when above a predetermined measured level within the enclosure, might need to be vented to maintain safe operating conditions.

A non-exclusive list of tests that can be performed by the system 100 according to the current invention, along with descriptions of the function of each of said tests under normal system operation, are set forth in Tables 2A and 2B below. It should be noted that these tests are categorized as being either "Component Tests" or "System Tests." "Component Tests" provide a reading or result without explanation to the user, while "System Tests" provide results that explain the significance of the collected data to the system user or assist the system user to record data manually.

TABLE 2A

| Component Tests | |
|---|---|
| Test Type | Description of Function of Test in Normal System Operation |
| Main Contactor | Measures the voltage across the main contactor K1. If voltage is out of normal range, failure or "issue detected" is signaled. |
| SCR | Open the main contactor K1 (note: SCR1 & SCR2 are main contactor K1 fail-safes). Measure voltage across main contactor K1. |
| System Controller | Monitored by the external watchdog connected to the system controller output located on the interface board; external watchdog is a timer that verifies proper system controller operation; in alternate embodiment the system controller and interface board are combined |
| Voltage Calibration | Verify manually with voltmeter (manual test) |
| Current Calibration | Verify manually with voltmeter (manual test) |
| Switches | Visually confirm activation of switches (manual test) |
| PWR Supply | Verify functioning of power supply using a voltmeter (manual test) |
| Relays | Verify the alarm and common relay function as according to manufacturer specifications when parameters being evaluated are out of range. |
| Load Box | Switch the load and look for an increase in current |
| 3rd Party Connection | Confirm activation/operation with stimulus (may not be available for all applications) |
| Tempco | Look for a temperature value that is in range, and if in range, report value and require user confirmation |
| Remote Sense | If voltage value within range, cross reference with the battery charger 106 |

TABLE 2B

| System Tests | |
|---|---|
| Test Type | Description of Function of Test in Normal System Operation |
| Battery Electrolyte Level | Either checked automatically via a sensor or visually inspected and entered into system 100 for data recording. Electrolyte Levels are monitored and recorded by system 100. |
| Connection Resistance | Checked manually by user and entered into system 100 for data recording |
| Condition of Rack | Checked manually by user and entered into system 100 for data recording |
| Visual Inspection | Checked manually by user or via camera and entered into system 100 for data recording |
| Unintentional Ground | System 100 reviews any ground events over specified time interval |
| Supply Voltage | System 100 verifies that supply voltage is within correct range (this voltage differs from float voltage because user need to account for voltage drops). System 100 will review trends and abnormalities over a user-specified period of time. System 100 can help user identify system 100 functionality during loss of power. |
| Float Voltage | System 100 verifies that float voltage is within correct range. System 100 will review trends and abnormalities over a user-specified period of time. System 100 can help user identify incorrect charging conditions or battery issues. |
| Battery Continuity | System 100 reviews battery continuity tests over a user-specified period of time. Test is confirmed through the presence of float current. |
| Float Current | System 100 analyzes trend of float current and adjusts float current according to temperature. System 100 cross-references float current measurement with age of battery and manufacturer-suggested values. If trend drifts from manufacturer-suggested values or user-inputted permissible ranges, system 100 warns user of potential issue. |
| Capacity Test | System 100 analyzes past and present/most recent tests to show performance trend over lifetime of battery, and will give warning if battery fails performance thresholds or is trending toward failure in specified amount of time that is less than the next scheduled test. A suggestion to run a capacity test may also be automatically triggered by the system 100 if one or more other key tests-e.g., connection resistance, float voltage, battery continuity, float current, and/or temperature tests-returns an undesirable or out-of-range result. |
| Temperature | System 100 analyzes both battery and ambient temperatures over lifetime of battery and estimates remaining service life based on industry standard equations. If, over time, the difference between ambient and battery temperature increases, system 100 will suggest possible explanations and/or troubleshooting tips. |
| Facility Demand | During an outage event, system 100 reviews the load profile of customer's site and determines whether the existing battery is sufficient for the load demands. If not, the system 100 will communicate that the batteries are insufficient to meet load demands. |
| Alarm Report | System 100 summarizes alarm events over a user-specified amount of time and provides a summary report to user. |

As is known in the art, the temperature of a battery plays a large role in the life and operation of the battery, for example, IEEE 450-2010 estimates that a VLA battery's life is reduced by 50% for every 10 degrees C. increase in average daily battery temperature over the rated (recommended) operating temperature (often 25 degrees C. for VLA batteries). The amount of available amp hours will also change based on battery temperature. Further, batteries self-discharge depending on their chemistry. For example, a fully charged VLA battery without a float current to charge the battery will self-discharge at a rate of approximately 3% of rated capacity per month. The float current required to maintain a full charge to the battery will be greater if the battery temperature is above the rated battery operating temperature and less if the battery temperature is below the rated battery operating temperature. For example, the float current required to maintain full charge of a typical lead-acid battery at 10 degrees C. above the upper limit of the battery's rated operating temperature range is typically double the float current required to maintain full charge the battery's rated operating temperature range.

It should be understood that the terms "temperature of a battery" and "battery temperature" are synonymous and both refer to an internal temperature of the battery in question, as opposed to ambient temperature. In general, the temperature of a VLA battery varies slowly in relation to ambient temperature. Further, in a bank or string of batteries, temperature might vary across the bank or string of batteries such that each battery is operating at a different temperature. Accordingly, it is preferable to measure the temperature of a plurality of batteries in a bank. Measuring the temperature of each battery in the battery bank will provide the most accurate temperature-related data but will also be the most complex and costly. Other preferred options include, measuring the temperature of the battery in the center of the battery bank (battery 109e in FIG. 2), or measuring the temperature of one battery in each row of a multi-row battery bank (i.e., batteries arranged in two or more vertically-arranged rows).

To get the most accurate battery temperature measurement, some embodiments might directly measure the temperature of the VLA battery's electrolyte, although this is not always possible, for example in the case of sealed batteries. In such situations, the temperature might be measured on the negative battery post, since that is generally in thermal contact with the largest, most temperature-stable part of the battery. Some described embodiments take instantaneous temperature samples continuously, particularly to monitor and record temperatures during other battery-related tests to account for test result variations. Alternatively, some embodiments might take temperature measurements at predetermined time intervals or one or more predetermined times of day. Some embodiments might further calculate battery temperature averages over one or more predetermined time periods, for example a daily average, a weekly average, a monthly average, an annual average, and an all-time average. The system might also track temperature extremes (e.g., high and low temperatures) over similar time periods.

Some embodiments generate an estimated battery life to display as battery status data on the user interface 120 of the integrated battery backup monitoring system 100. Preferrably, estimated battery life is calculated as a function of time and battery temperature. For example, described embodiments employ the method described below to determine an estimated remaining life $L_r$ of the batteries 109a-109i. In this embodiment, estimated battery life is determined daily. In alternate embodiments, other frequencies could be used. Equation 1 is used for that day's estimate if the average battery temperature for that day $D_a$ is greater than the rated temperature $L_T$ and Equation 2 is used for that day's estimate if the average battery temperature for that day $D_a$ is less than or equal to the rated temperature $L_T$.

$$L_{ry} - \left(\frac{1}{P} + 1\right) = L_r \quad (1)$$

$$L_{ry} - 1 = L_r \quad (2)$$

$L_{ry}$ represents that value of $L_r$ as calculated on the previous day. As noted above in Table 1, P represents the percentage of life reduced at daily average temperature. On the date the batteries are put into service, $L_r$, is 100% of the expected service life of the batteries.

Thus, described embodiments provide a rough estimate of battery life to users, for example via the user interface 120 of integrated battery backup monitoring system 100, or by reporting the battery life data to a remote location via communication link 114. In some embodiments, the estimated battery life is displayed as a bar chart showing the estimated battery life relative to 100%. Temperature data might be similarly displayed on the user interface 120. Numerical data might be provided to the remote location, which might generate its own graphical representation of the estimated battery life and battery temperature data.

The integrated battery backup monitoring system 100 might provide warnings or generate error conditions, through the user interface of the battery monitor 104, via communication link 114 and/or through the aggregated system status indicator 122. Such warnings or error conditions would be triggered if the estimated battery life falls below a predetermined threshold or if the batteries 109a-109i have been exposed to temperature that exceeds a predetermined temperature threshold for a length of time exceeding a predetermined time period. In general, a warning would be generated at a higher predetermined threshold for estimated battery life than for the generation of an error condition. Similarly, in general, the battery temperature and/or time thresholds for a warning would typically be lower than those required to generate an error condition.

In some embodiments the integrated battery backup monitoring system 100 generates suggested solutions to the warning conditions, based on the warning condition and the setup of the DC subsystem. For example, in a DC subsystem that does not include a cooling or ventilation system for the batteries 109a-109i, the integrated battery backup monitoring system 100 might recommend installing a ventilation or cooling system if the batteries are routinely operating at excessive temperature. Similarly, the integrated battery backup monitoring system 100 might suggest replacing batteries 109a-109i whose estimated life is below a predetermined threshold. Errors might also be displayed on the overall system health indicator on an external surface of the integrated battery backup monitoring system 100 and the errors might also be communicated to a remote location for reporting to a technician.

Figure 3:
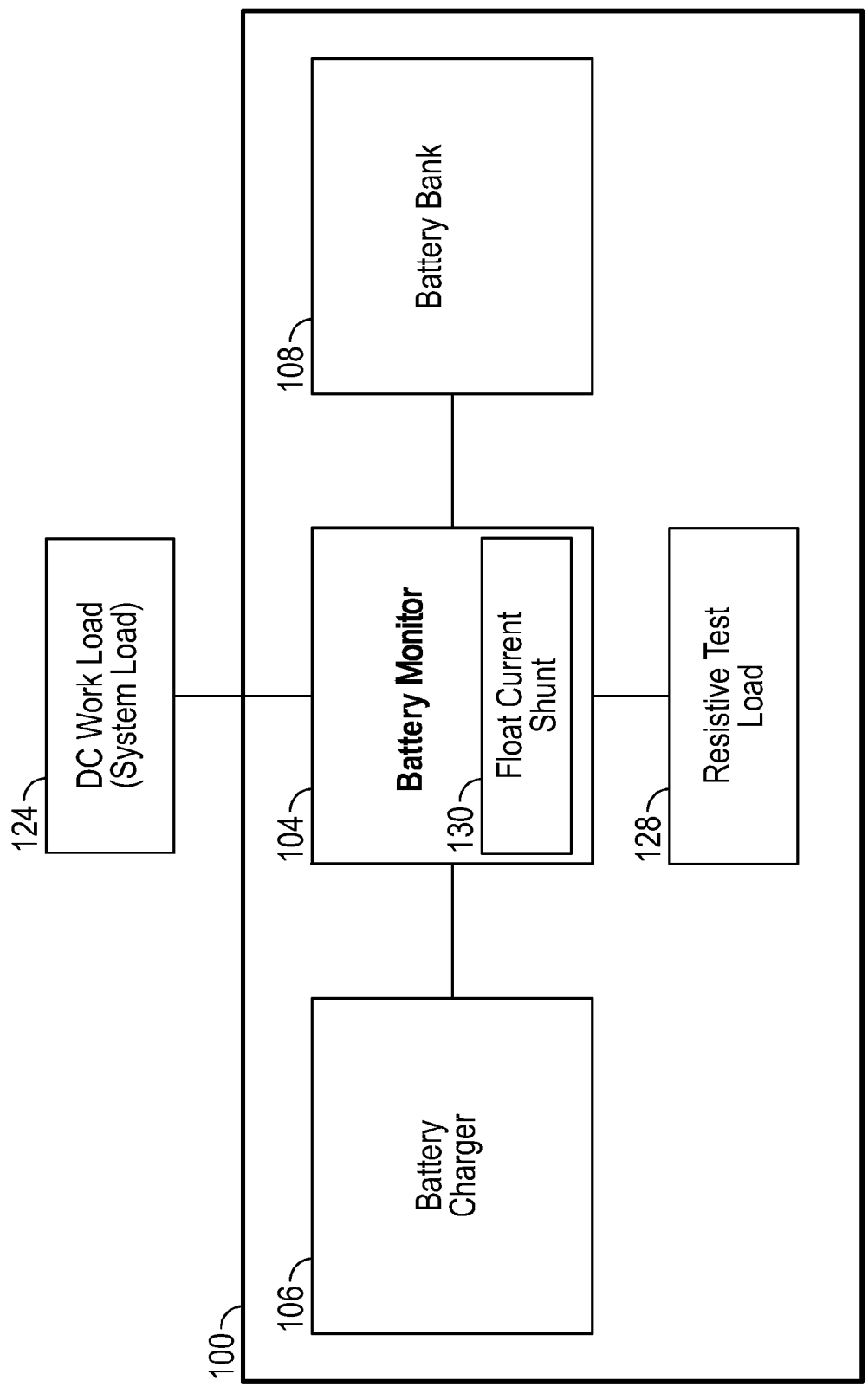
FIG. 3 shows greater detail of a battery monitor of the system of FIG. 1.

FIG. 3 shows additional detail of battery charger 106. In embodiments of the integrated battery backup monitoring system 100 that monitor the battery charger 106, battery monitor 104 might also perform testing of battery charger 106. In current DC substation systems, the battery charger is not typically tested, and the battery charger 106 will operate in a low current state (i.e., a float current), while providing power to the system load 124. The float current state is a current sufficient to keep any of the batteries 109a-109i in the battery bank 108 from self-discharge. The current required to keep the battery bank 108 charged in float operation is a fraction of the operating current required to recharge the battery bank 108. Thus, a battery charger 106 could operate in float current state and appear fully functional while being incapable of reliably supplying the current levels required to recharge the battery bank 108. A failure of the battery charger 106 can result in the discharge of the battery bank 108, which would leave the substation unprotected and inoperable in the event of a loss of power.

In order to improve reliability, this embodiment of the battery monitor 104 periodically tests the functionality of the operation of battery charger 106, by adding a constant resistive test load 128 to the output of the battery charger 106 and measuring the average voltage output of battery charger 106. The frequency of the test is preferably determined by a user-determinable setting. If the voltage output of the battery charger 106 is outside of a first user specified performance threshold, an error condition will be indicated. A user can set the battery monitor 104 to perform a test of battery charger 106 at specified intervals (e.g., once per day, once per week, etc.) or when a test command is provided. For example, a test command might be provided by a user operating the user interface 120, or by a test command being received from the remote device 112.

Described embodiments will operate the battery charger 106 at its full rated load for a predetermined amount of time to determine the voltage output level of the battery charger 106. By testing the battery charger 106 under its full rated load, if the output of the battery charger 106 is not sufficient to supply the current needed to fully recharge the batteries 109a-109i in the battery bank 108, an error condition is indicated for a technician to further investigate the connections, control, and condition of the battery charger 106. The frequency with which battery monitor 104 tests the battery charger 106 can be set by the user.

Figure 4:
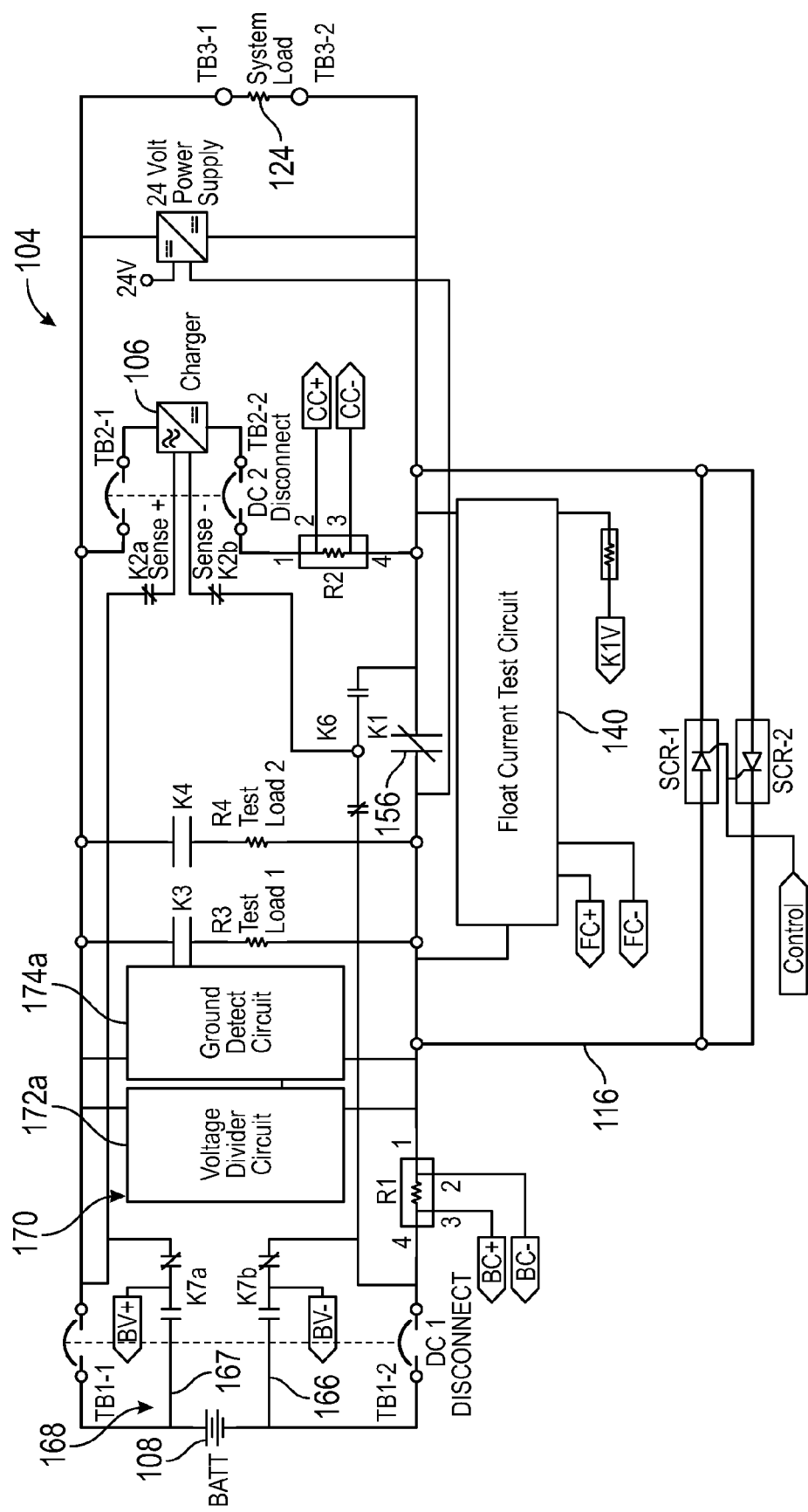
FIG. 4 shows a schematic diagram of a battery charger tester of the system of FIG. 1.
Figure 6:
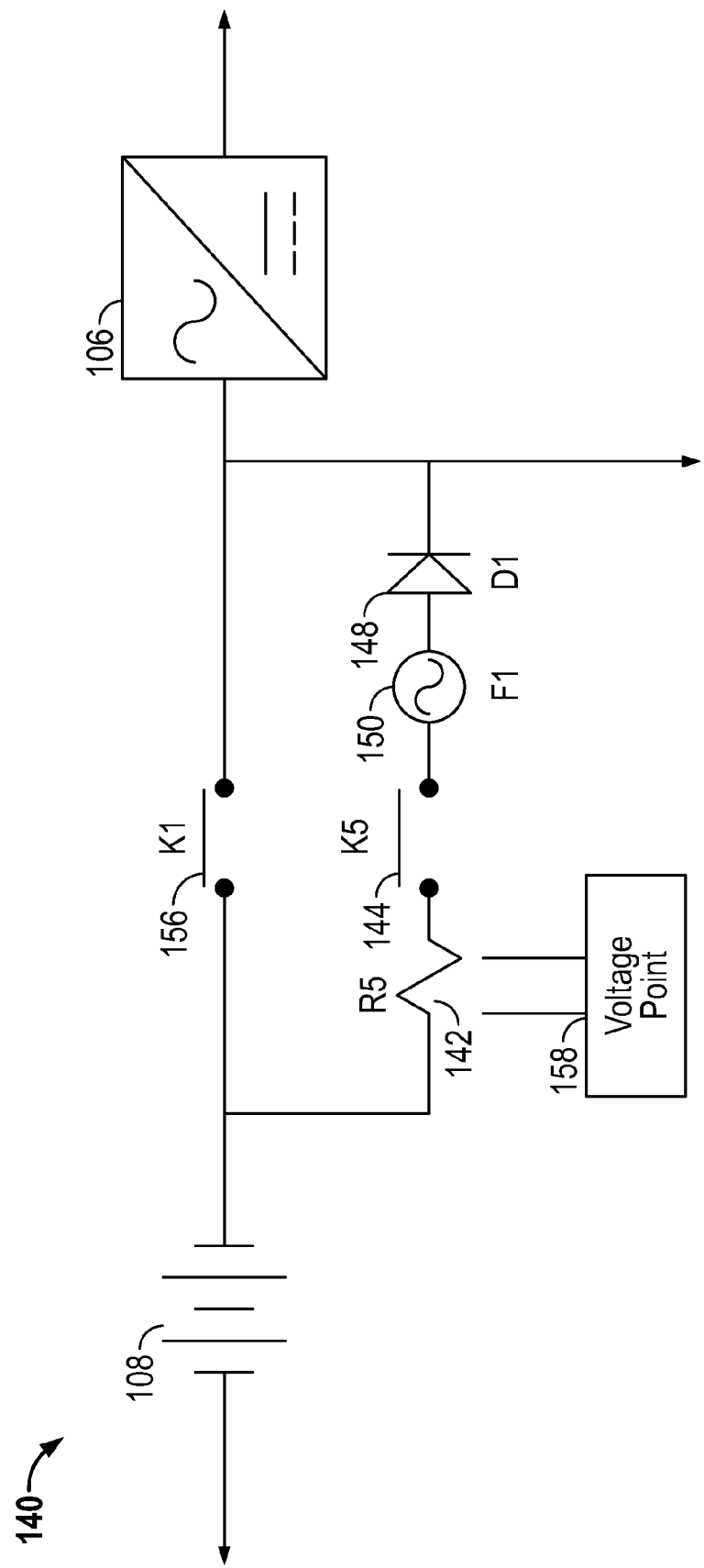
FIG. 6 shows a schematic diagram of an embodiment of a float current test circuit of the system of FIG. 1.
Figure 7:
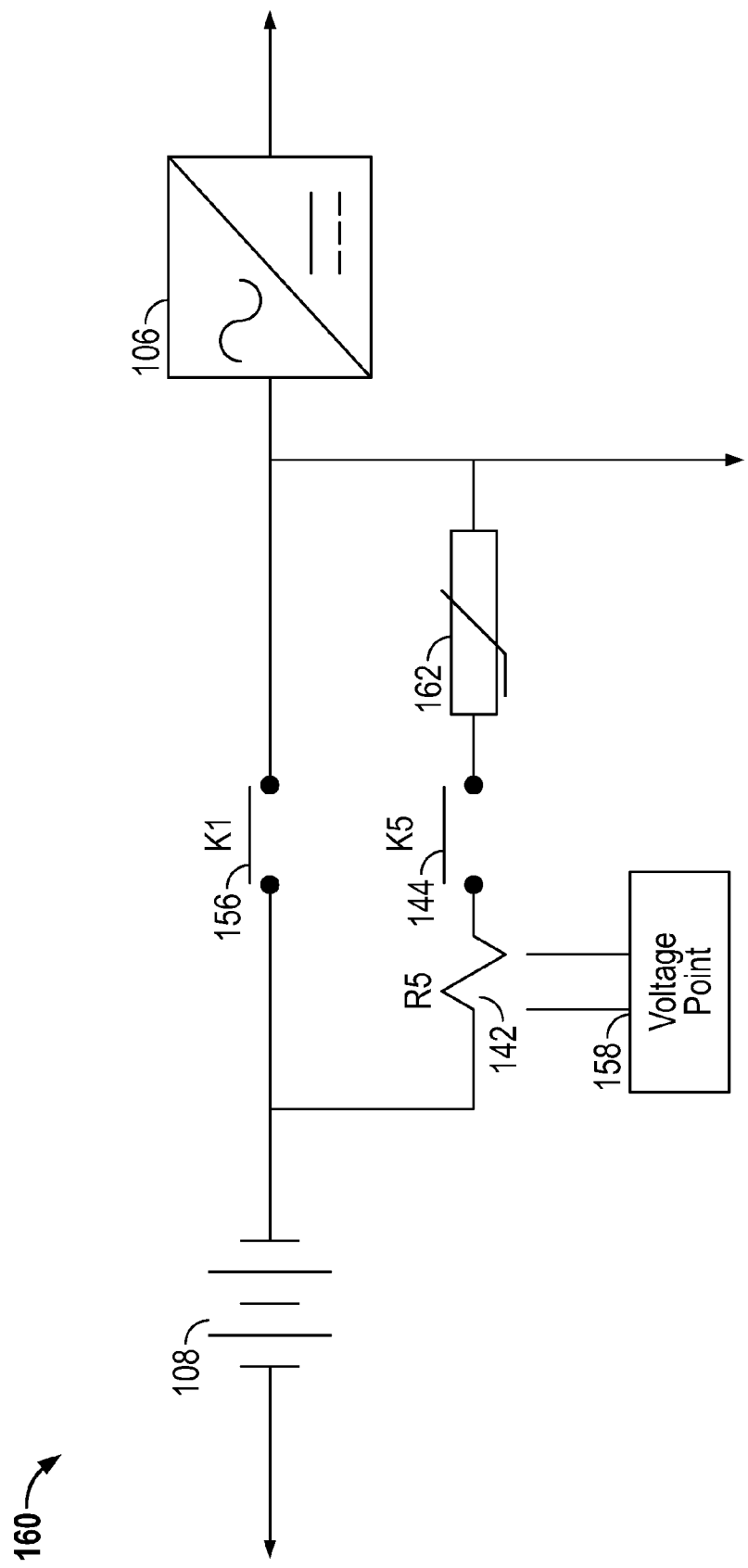
FIG. 7 shows a schematic diagram of an alternate embodiment of a float current test circuit of the system of FIG. 1.

FIG. 4 shows a schematic of an exemplary embodiment of the battery monitor 104. Details of exemplary float current test circuits 140 are shown in FIGS. 6 and 7. Table 3 includes a non-exhaustive list of component descriptions of FIG. 4.

TABLE 3

| K1 | Main contactor - isolates the Battery from the Battery Charger and system load during selected system tests | SCR-1 & SCR-2 | Safety bypass switches/ Fail safe SCRs - create protective paths for current to flow in case of main contactor K1 fail and insure that the system loads are never disconnected from the Power Supply |
|---|---|---|---|
| K2a & K2b | Remote sense contactors - removes charger from the DC bus | TB1-1 & TB1-2 | Battery connection terminals |
| K3 | First load contactor - adds resistive load to charger or battery | TB2-1 & TB2-2 | Battery charger connection terminals |
| K4 | Second load contactor - adds second resistive load to first load contactor | TB3-1 & TB3-2 | System load terminals |
| K5 | Float current contactor - allows current to pass through float current circuit | DC1 | Battery disconnect |
| K6 | Remote sense contactor - moves the remote voltage sense from the battery to the load side of the main contactor K1 | DC2 | Charger disconnect |
| R1 | Battery/System Shunt - calculates amperage to or from the battery | F1 | Float current fuse - protects R5 shunt in case of failure |

TABLE 3-continued

| R2 | Charger Shunt - calculates amperage leaving the batterycharger | D1 | Float current diode - allows current flow in only one direction |
|---|---|---|---|
| R3 | Load Resistor 1 - allows for a higher resistance | BATT | Battery source (e.g., battery bank 108) |
| R4 | Load Resistor 2 - applies battery continuity load | CHARGER | Battery charger (e.g., battery charger 106) |
| R5 | Float Current Shunt - measures float current charge when active | Power Supply (24 Volt DC) | DC to DC converter to power Battery monitor from charger and battery power |

Float Current Testing

Figure 5:
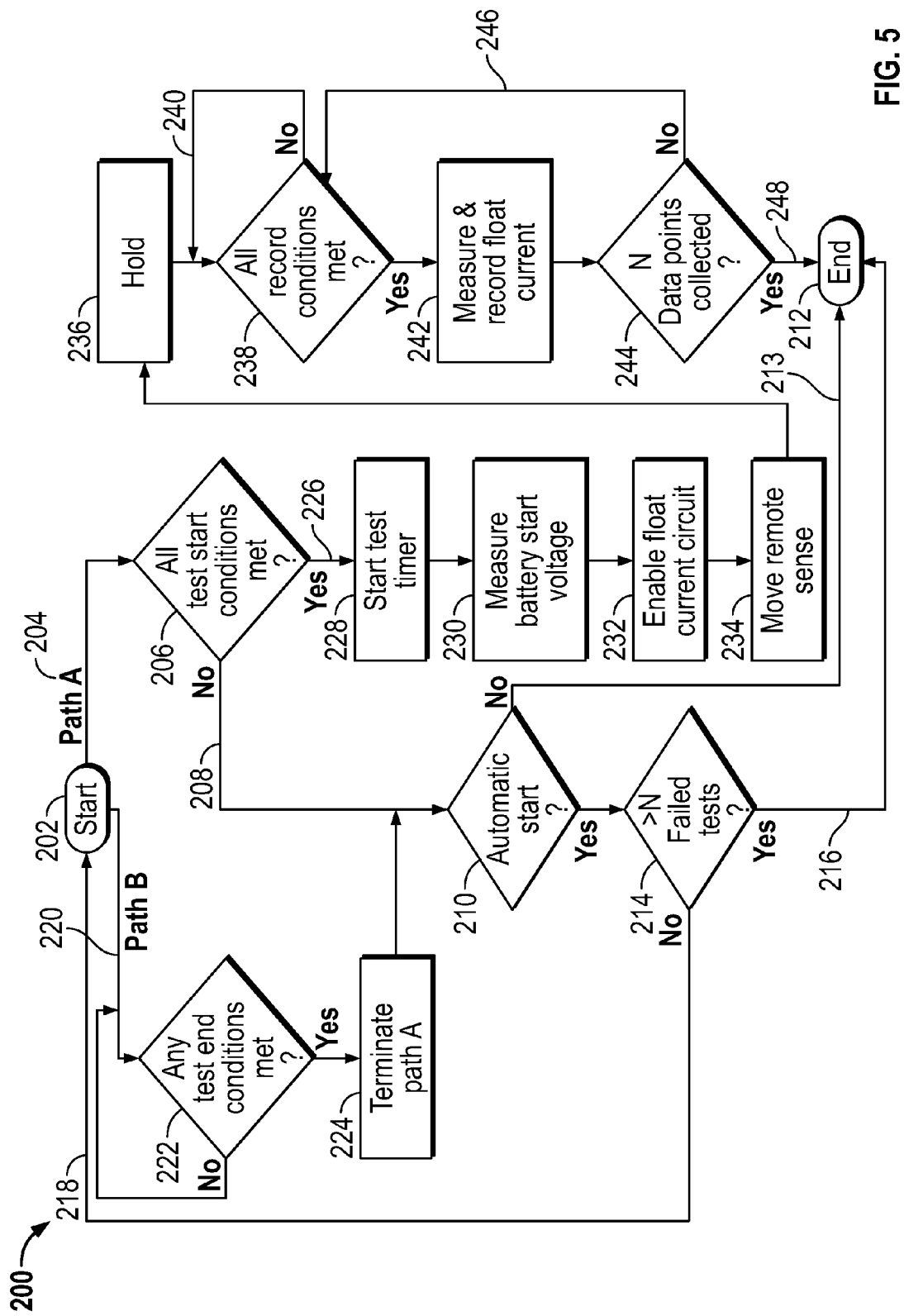
FIG. 5 shows a flow diagram of a float current test performed by the system of FIG. 1.

FIG. 5 is a flow chart showing steps involved in performing an exemplary float current test performed by some embodiments of the integrated battery backup monitoring system 100. Additional details regarding the float current test are provided below. As explained above, float current is the amount of current necessary to maintain the batteries 109a-109i in the battery bank 108 in a charged state.

The float current required to maintain batteries 109a-109i will change over time. Some factors, such as a change in battery temperature, may result in a temporary change in the required float current. Other factors, such as battery age and chemistry, result in an irreversible increase in the required float current. Thus, measuring float current and repeatedly measuring float current over time can provide valuable information on the health of the battery.

With reference to FIG. 5, the float current test 200 is performed according to the following steps. The float current test begins at start step 202, at which point checks along both "Path A" 204 and "Path B" 220 are run simultaneously. During an initial pre-testing phase according to Path A 204 shown in FIG. 5, several test start conditions are checked before the float current test is performed. These test start conditions include the following checks: that the battery is not currently discharging and has not been discharged recently (e.g., within the past 24-72 hours); that the battery is not currently charging and has not been charged recently (e.g., within the past 24-72 hours); that the battery voltage is within the defined float voltage range; that there are no other tests currently running; and that there are no failures detected in the system 100. If, at step 206, the system determines that less than all of the test start conditions are true, it will follow the "NO" path 208 and determine whether the test was scheduled to run automatically at step 210. If, at step 210, it is determined that the test is not scheduled to run automatically, the test will follow path 213 to end step 212. If instead, at step 210, it is determined that the test has been scheduled to run automatically, the test will advance to step 214 at which point the system will check again whether all test start conditions are satisfied. Step 214 will be repeated up to a pre-determined number of times N+1 on a predetermined schedule until either of the following two conditions are met: (a) >N failed tests are recorded, at which point the test will follow path 216 to end step 212; or (b)≤N failed tests are recorded (i.e., the test start conditions are satisfied prior to >N failed tests being recorded), at which point the test will follow path 218 back to start step 202.

As noted above, while the Path A checks are occurring, a check along Path B 220 is simultaneously occurring. The Path B 220 check begins at step 222, wherein the system checks whether any test end condition is met. If, at step 222, it is determined that any test end condition is met, the Path A checks are terminated at step 224 and the test moves to "NO" path 208 noted above and the test continues exactly as described in the preceding paragraph. If instead, at step 222, it is determined that no test end conditions are met, the test returns back to the beginning of the Path B 220 check process, resulting in the system continually rechecking whether any test end condition is met at step 222. Test end conditions include the following: the total float current test time exceeds X minutes (e.g., 10 minutes); the battery begins to charge; the battery begins to discharge; and the desired number of data points N have been collected (e.g., N could have a value between 10-100).

Referring again to FIG. 5, if at step 206 the system determines that all of the test start conditions are true, it will follow path 226, the test contact (not shown) is closed, and the float voltage test timer is enabled at step 228 and starts to count for the test period. When the float voltage test timer reaches one second, the battery start voltage is recorded (step 230).

When the float voltage test timer equals two seconds, the float current circuit is enabled at step 232. When the float voltage test timer equals three seconds, the main contactor K1 is opened, disconnecting the normal load circuitry, and the float current contactor K5 is closed, closing the float current circuit. When the float current contactor K5 closes, it will also transfer remote sense to the battery connection terminals TB1-1, TB1-2 at step 234. The remote sense contactor K6 will thus be moved to the opposite side of K1. During this time, the battery monitor 104 receives its power from the battery charger 106. In an alternative embodiment, step 234 could be performed prior to or simultaneously with step 232. The system then proceeds to a hold step 236, wherein the system waits for a predetermined period of time (e.g., between 5-60 seconds).

After the hold step 236, the system proceeds to step 238 where a check is performed to determine whether both of the following record conditions are met: (a) the battery voltage is no more than 0.3% above or below the battery start voltage measured in step 230; and (b) the float current is greater than zero. If both conditions are not met, the system moves along path 240 and continues to recheck whether both record conditions are met at step 238. If both conditions are met, the system measures and records the float current at step 242. The system will then advance to step 244 where it determines whether N float current data points have been collected. If N data points have not been collected, the system returns to step 238 via path 246. The system will continue to operate the loop of steps 238, 242, and 244 at a pre-determined interval (e.g., every second) until N float current data points have been collected, at which point the system will follow path 248 to end step 212. In some embodiments, Y has a value between 10-100.

When the float current circuit 140 is activated, circuit resistance is increased, thereby decreasing the remote sense voltage for a short period of time. The remote sense contactor K6 will sense the voltage decrease and the charger 106 will attempt to compensate by increasing the voltage. Once the system controller 102 sees that the voltage has been increased to at least 0.1% of VS, the system controller 102 will take a measurement. After the float circuit current has been read, the test will end and the system is reset to normal conditions.

Once the float current data points have been collected, the data is inserted into a non-compensated data pool in which the float current data points are collected and averaged. The system may also generate a pool for temperature-compensated float current in which the float current data points are collected and averaged.

As is known in the art, a battery's self-discharge is related to the rate of chemical reaction within the battery cell. Typically, a fully charged, healthy VLA cell will discharge at a rate of 3-6% per month at its rated temperature (typically 25 degrees C.). As the electrolyte temperature increases above 25 degrees C., the chemical reaction speed increases exponentially, doubling every 8.3 degrees C. rise in temperature, which proportionally reduces the battery life and increases the required float current at a rate equal to the chemical reaction speed. Thus, the overall health of a battery system can evaluated by accurately measuring float current measurements and operating temperature over time.

Float current can be affected by many aspects of the battery health including but not limited to: sediment build-up at the bottom of a cell that might begin to cause shorts which could increase float current; higher internal cell resistance due to positive plate corrosion; intercell linkage; a battery ground fault and/or power loop might increase float current and/or overcharge the battery; and high alternating current (AC) ripple on the battery charger output might create excess heat during battery charging which in turn might raise the float current. Finally, in the case of VRLA cells, excessive float voltage could eventually cause cells to dry out, also leading to a higher float current and higher operating temperatures, perhaps even resulting in thermal runaway.

In a typical system, the battery charger 106 is connected directly to the battery bank 108. The connection to battery bank 108 from the battery charger 106 carries the maximum recharge current (e.g., when all batteries in the battery bank are fully discharged) and the float current to maintain a full charge of the batteries 109*a*-109*i* of the battery bank 108. Described embodiments of battery monitor 104 provide a float current shunt 130 of FIG. 3 to accurately measure the float current.

Since float current might change after a battery event (e.g., a battery temperature change, a battery discharge, recharge, water being added to the battery cells, etc.), float current might change over time. Thus, described embodiments of battery monitor 104 test float current at specific predetermined times. For example, a new VLA or VRLA battery has a settling period in which the plates, electrolyte, and paste begin to "break in" for several weeks during which the float current is at an elevated level of what it will be after the battery has been broken in. A completely discharged battery's electrolyte has a specific gravity near that of water (e.g., a relatively low specific gravity) related to the separation of the previously charged chemical compounds of the cells. After the battery is recharged the charged compounds are stratified throughout the cell with heavier, more charged electrolyte near the bottom of the physical cell and lighter, less charged electrolyte near the top of the cell. Thus, as a cell receives a float current, the less charged electrolyte near the top of the cell is still charging, which in turn creates the appearance of a higher float current to the battery. After a discharge or extended period of being non-equalized (e.g., a long period of buildup of stratification, or sulfate build-up on the battery plates called "sulfation"), the overall capacity of the battery might be reduced unless equalization is performed. Equalization is an overcharge performed on lead acid batteries after they have been fully charged to reduce the buildup of stratification and sulfation by cycling the cell's electrolyte mix throughout the cell. For example, any addition to the battery's water level will affect float current, requiring equalization.

In described embodiments, at least one temperature sensor (e.g., temperature sensor 126 of FIG. 2) is placed on at least one battery cell 109a-109i of the battery bank 108, such that battery charger 106 can actively adjust its output voltage up or down to account for a rise or decrease in battery temperature and, thus, maintain the float current at a relatively constant value. Described embodiments make float current measurement after the break in period of a new VLA battery. These measurements serve as a baseline to monitor and adjust float current as a function of battery temperature. When there is a change to the system wiring or new replacement cells are added, a new baseline measurement is preferably taken.

For trending a temperature-compensated charger, the baseline measurement will be of an approximate equal comparison. To properly trend a non-temperature-compensated unit, the measured float current is preferably normalized to adjust for fluctuations in the measured temperature. One way to calculate a temperature-compensated float current $FC_T$ is set forth in Equation 3:

$$FC_T = FC_{25} \times 2\left(\frac{\exp^{(T-25)}}{M}\right) \quad (3)$$

$FC_{25}$ is the float current at 25 degrees C. The multiplier conversion number M is provided by the battery technology, and is typically provided by the manufacturer. For most batteries, multiplier conversion number M will be an integer between 8 and 10. In other embodiments, other methods for calculating a temperature-compensated float current $FC_t$ could be used.

When setting high and low alarm set points, care must be taken to avoid inaccuracy. It is common in the art to set an alarm to trigger based on a float current value that is double or triple the baseline measurement. In this embodiment, a different approach is used. A percentage is used to compare baseline measurements. The measured value is divided by the baseline. If the resulting percentage is above the set point (for example, 200%), then an alarm should be set. Equation 4:

$$\text{If } \frac{FC_t}{B} \times 100 > \text{Set Point, then set } C3 \quad (4)$$

FIG. 6 shows a schematic diagram of an embodiment of a float current test circuit 140 of the system 100 of FIG. 1. Although shown in FIG. 6 as being a discrete test circuit, in alternative embodiments float current sensor might employ a temperature-compensated float current sense integrated circuit that is accurate at the high currents for battery discharge and recharge while also sensing low currents during float charging. The integrated circuit might also sense voltage and temperature from the battery bank 108.

In this embodiment, the float current test circuit 140 comprises a float current test shunt 142 (also labeled R5 in FIGS. 6 and 7) that is connected to a float current relay 144 (also labeled K5 in FIGS. 6 and 7). The float current relay 144 is connected to a diode 148, and diode 148 is connected to a fuse 150. The connected series of the float current test shunt 142, float current relay 144, diode 148, and fuse 150 is connected in parallel with the main contactor 156 (also labeled K1 in FIGS. 6 and 7). The battery bank 108 is connected to a first side of the main contactor 156 and the battery charger 106 is connected to a second side of the main contactor 156. A voltage point 158 is connected to the float current test shunt 142.

FIG. 7 shows a schematic diagram of an alternate embodiment of a float current test circuit 160 that could be used with the system of FIG. 4, in place of the float current test circuit 140 shown in FIG. 6. The float current test circuit 160 according to FIG. 7 differs from the float current test circuit 140 according to FIG. 6 only in that the fuse 150 and diode 148 have been replaced by a resettable fuse 162. The float current test circuits 140,160 are used to perform a periodic float current test via the method described above and set forth in the flow chart of FIG. 5.

As shown in FIG. 4, a fail-safe circuit 116 is preferably provided to maintain DC power to the system load 124 in the event of a failure in the float current test circuit 140 and/or the main contactor K1. In this embodiment, the fail-safe circuit 116 consists of two silicon controlled rectifiers ("SCR"), SCR-1 and SCR-2, which are arranged in parallel and in opposite orientations. The ends of the fail-safe circuit 116 are connected to the load circuit on opposing sides of the main contactor 156.

When activated, each of the silicon controlled rectifiers SCR-1, SCR-2 will allow current to flow through contactors in one direction (the direction indicated by the arrow in each rectifier) if a voltage differential exists across the contactor. When deactivated, current cannot flow in either direction. Each of the silicon controlled rectifiers SCR-1, SCR-2 is preferably configured to default to an active state, meaning that each of the silicon controlled rectifiers SCR-1, SCR-2 is activated unless a deactivating signal is being received from the system controller 102. Preferably, when a test is running that results in the main contactor K1 being open, the system controller 102 is programmed to deactivate the silicon controlled rectifiers SCR-1, SCR-2 until and unless the main contactor 156 fails. A failure of the system controller 102 (such as a loss of power) would also cause the silicon controlled rectifiers SCR-1, SCR-2 to activate.

The configuration of the fail-safe circuit 116 in this embodiment provides several benefits over use of a diode as a fail-safe, including greater flexibility of configuration and the ability to allow current to flow in either direction in the load circuit if both silicon controlled rectifiers SCR-1, SCR-2 are activated. In alternate embodiments, other types of fail-safe devices could be used instead of silicon controlled rectifiers. Examples include bidirectional triode thyristors and solid state relays. As used in the specification and claims, the term "fail-safe device" is intended to mean any silicon controlled rectifier having a first mode in which current can flow only in one direction through the device and a second mode in which current cannot flow in either direction through the device. Preferably, the fail-safe device is operationally configured so that it defaults to the second mode unless a signal is being received that causes the fail-safe device to enter the first mode.

Regardless of the specific electrical components employed, the fail-safe circuit 116 is preferably operationally configured to enable current to flow in either direction through the fail-safe circuit 116 when a voltage differential exists across the fail-safe circuit 116 and either (a) a failure is detected in at least one of the circuits spanned by the fail-safe circuit (in this embodiment, the main contactor 156 and the float current test circuit 140) or (b) the system controller 102 fails. Conversely, the fail-safe circuit 116 is preferably operationally configured to selectively prevent current flow in either direction when the system controller 102 is operating properly and current is flowing properly through at least one of the circuits spanned by the fail-safe circuit.

Battery Capacity Testing

Figure 8:
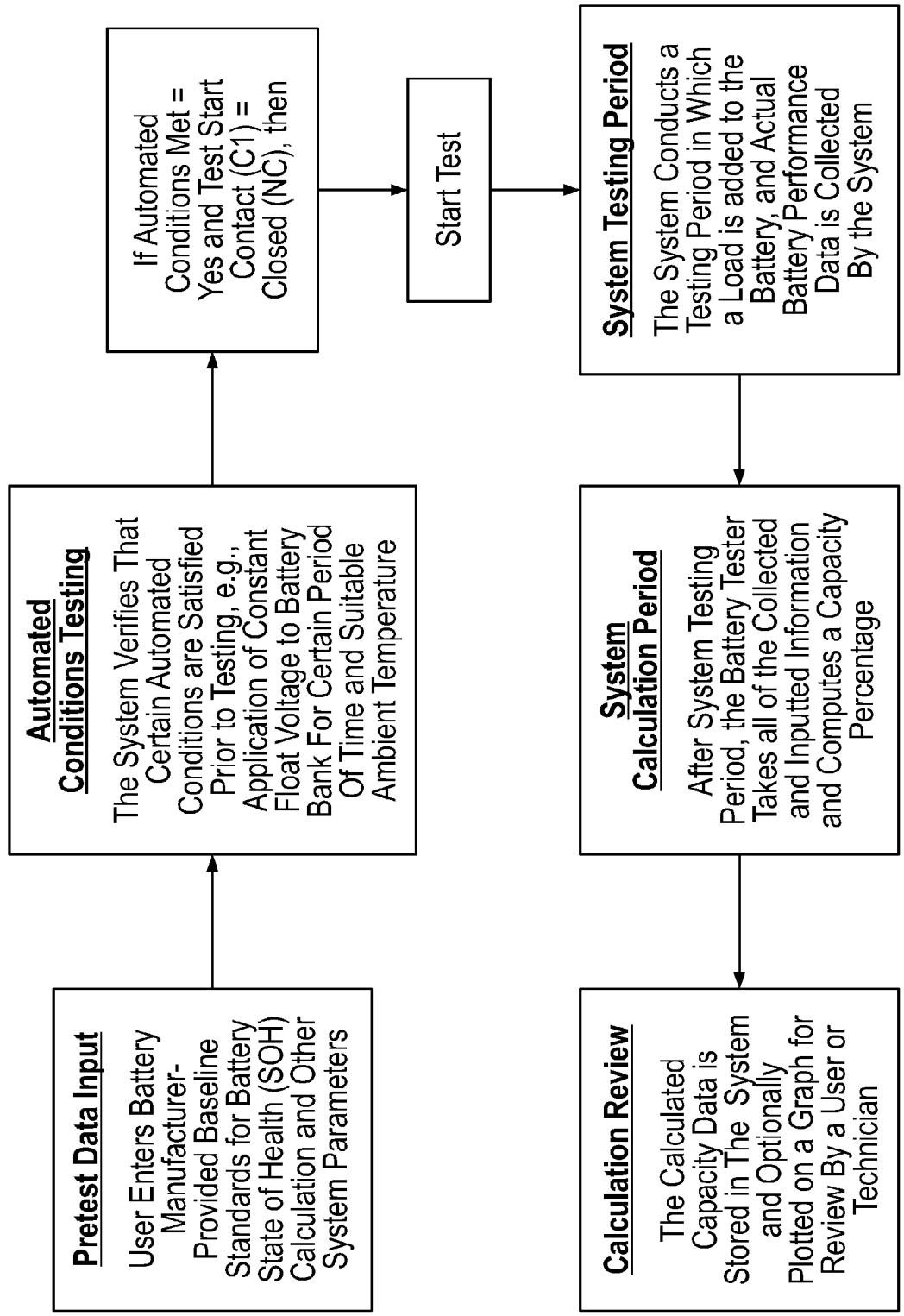
FIG. 8 shows a flow diagram of a battery capacity test performed by the system of FIG. 1.

FIG. 8 shows a flow diagram of a capacity test performed by battery monitor 104. A capacity test is a specified rate of discharge that compares the battery manufacturer's discharge data to actual discharge data to assess the state of health (SOH) of the battery bank 108. As noted in Table 2, above, the suggestion to run a capacity test may be automatically triggered by the system 100 if one or more other key tests—e.g., connection resistance, float voltage, battery continuity, float current, and/or temperature test—returns an undesirable or out-of-range result. This automatic capacity testing provides the system 100 with system failure predictive capabilities that represent improvements over known prior art systems.

Discussed in IEEE 450-2010, there are three basic categories of capacity tests: acceptance, performance, and modified performance. To judge the SOH of a battery that has been in service for a period of time, a performance test is often used. A performance test lasting longer than one hour uses a time-adjusted method, which adjusts the actual time based on temperature. Tests shorter than one hour typically use a rate-adjusted method, which adjusts the actual discharge rate based on temperature. For the battery monitor 104 of the system 100 of the current invention, the time-adjusted method is used. Use of the time-adjusted method is preferred in this embodiment due to the load requirements for the rated-adjusted method.

When a battery leaves its manufacturer, it is expected to adhere to certain standards. These manufacturer-designated standards are a baseline for SOH. The battery will degrade because of many factors and the SOH of a battery will degrade over time to a point lower than optimal use. There are many ways to test the battery's SOH. It is generally understood in the art that a capacity test is the most comprehensive way to determine a battery's SOH.

The time-adjusted capacity test for the battery monitor 104 has three major components. The first component is pretest data collection, where the user will input specific information regarding the current physical data and battery manufacture data provided by the battery manufacturer. The second component is the testing period in which a load will be added to the battery to collect data on the actual battery performance. The third component is the calculation period in which the user-inputted data, along with the recorded data, will calculate how well the battery performed compared to the manufacturer-provided data. Below is an explanation of the steps taken in each step.

Pretest data collection takes place during installation, during which time the user must input a number of different system parameters. User entered data includes: recommended float voltage range per cell ($V_{flow}$ to $V_{high}$); Number of cells in string (Ncells); and Discharge time at rated battery monitor 104 current load (Dtime).

Before testing, the electrolyte temperature of at least one of the battery cells is measured, then averaged according to Equation 5, below.

$$Tstart = (T1 + T2 + T3 + \ldots Tx)/x. \qquad (5)$$

In many embodiments, electrolyte temperature will be measured in only one cell. In embodiments with a relatively large number of cells, it may be preferable to measure electrolyte temperature in up to 10% of the cells.

Before any capacity test can start, a set of test start conditions are preferably met in order to achieve accurate results, including inter-cell connection resistance and electrolyte. Inter-cell connection resistance is preferably recently checked for high resistance, and fixed if not within manufacturer specifications or near a baseline. Electrolyte is preferably at recommended levels and an equalize charge is preferably performed after topping off electrolyte. Optionally, the test start conditions could also include verification that any DC system failure back-up precautions are active.

Battery monitor 104 automated conditions are also preferably satisfied prior to testing. The battery monitor 104 uses a system timer to ensure at least 24-72 hours of constant float voltage has been applied to battery. Battery monitor 104 can communicate with battery charger 106 and issue an equalizing charge. The equalizing charge could be scheduled to issue ahead of a scheduled capacity test, the latter of which requires a technician to go out to the site to perform the capacity test.

The testing period begins when conditions are met and the test start contact (not shown) is closed. When the test has started, the main contactor K1 is opened, which will separate the battery from the system load, and the first load contactor K3 is closed, which will connect the first test load R3 to the battery bank 108. In this embodiment, the following conditions will end the testing period: when battery charger 106 voltage drops below a low voltage set point or when battery terminal voltage drops to an end voltage. Preferably, the test can be manually terminated by a button press.

When the test ends, the following contacts will reset: the first load contactor K3 is opened, which will remove the load from the battery, and the main contactor K1 is closed, which will reconnect the battery to the system load 124 and the charger 106.

During the calculation period, the battery monitor 104 takes all of the information collected and computes a capacity percentage. The battery monitor 104 preferably normalizes capacity as a function of battery temperature and finds a suitable conversion ratio based on the starting battery temperature average.

Importantly, the capacity test used in this embodiment is a constant resistance test, meaning that the current being applied to the test circuit is not adjusted during the test to maintain constant power as voltage drops and the resistance applied to the circuit is constant for the duration of the capacity test. Constant resistance-based capacity testing is desirable because it enables the use of less complex testing circuitry. However, most IEEE standards and manufacturer battery performance data is based on constant current or constant power capacity tests. Accordingly, there was a need to develop a basis for comparing the test results from a constant-resistance capacity test to data to constant current or constant power capacity based performance data and standards. In other words—to provide the user with ability to more accurately determine the SOH of the battery (and determine when replacement is necessary) using data collected from a series of constant-resistance capacity test.

One challenge associated with calculating capacity using a constant-resistance capacity test is to determine appropriate values to use for the current applied to the test circuit because the current varies over the discharge period and is understood to vary in a non-linear manner. Applicants discovered that measuring the current flowing through the test circuit at relatively short intervals and using the mean (average) of all current measurements provided a capacity calculation that deviated very little from capacity calculations from constant-current capacity tests. The measurement interval is preferably less than one minute and, more preferably, less than 10 seconds. In this embodiment, the measurement interval was one second.

Figure 9:
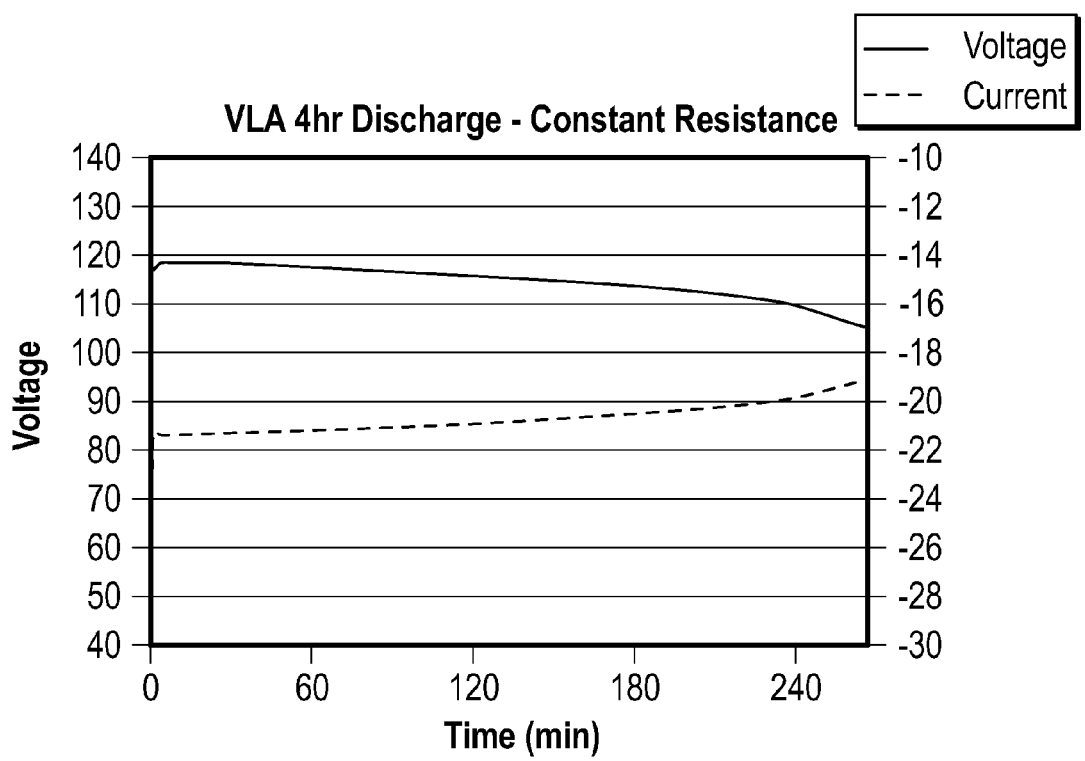
FIGS. 9 and 10 show graphs of voltage and current plotted against discharge time for constant-resistance capacity test performed on two different batteries.
Figure 10:
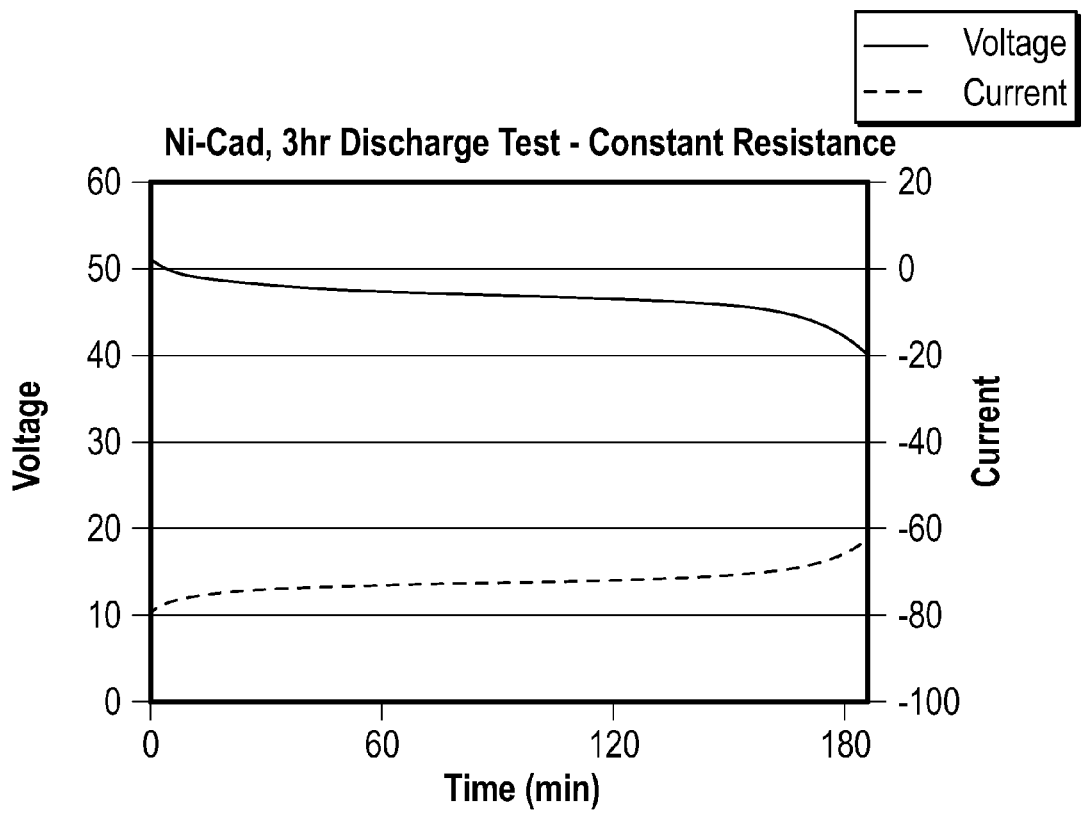

Applicants discovered this relationship by conducting constant-current and constant-resistance capacity tests at different discharge rates on both mature and new VLA and Ni-Cad batteries. FIG. 9 shows voltage and current plotted over the duration of a constant-resistance test on a 130 volt lead-calcium alloy battery having 60 cells, using a four-hour discharge rate. As can be seen in FIG. 9, the voltage and current curves mirror each other. The current curve is relatively flat with a drop at the end of the discharge period. FIG. 10 shows voltage and current plotted over the duration of a constant-resistance test on a 48 volt Ni-Cad battery having 40 cells, using a three-hour discharge rate. As was the case with the lead-calcium alloy battery, the voltage and current curves mirror each other during discharge of the Ni-Cad battery and the current curve is relatively flat during the main discharge period. The Ni-Cad battery shows a distinct drop at the beginning of the discharge.

Applicants evaluated several different techniques to obtain a value for current from the data collected in the constant-resistance tests that would provide capacity calculations that closely tracked the capacities measured by constant-current tests. As noted above, it was determined that an average of current measurements taken at relatively short intervals provided a relatively accurate rated discharge time calculation (described below)—averaging 0.3% difference from capacities calculated from the constant-current tests conducted by the applicants.

Another key to the ability to provide a relatively accurate rated discharge time calculation was the discovery that a linear relationship existed between a capacity factor $K_t$ (calculated under IEEE 485/1115) and the discharge time for each capacity test.

Figure 11:
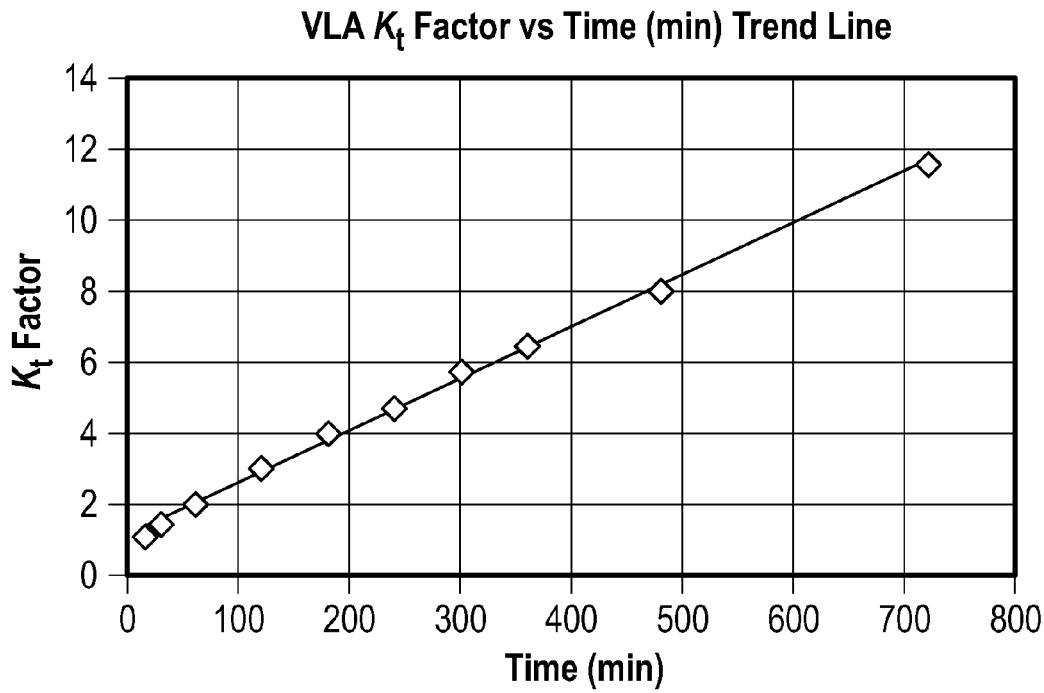
FIGS. 11 and 12 show graphs of a capacity factor $K_t$ plotted against discharge time for constant-resistance capacity test performed on two different batteries.
Figure 12:
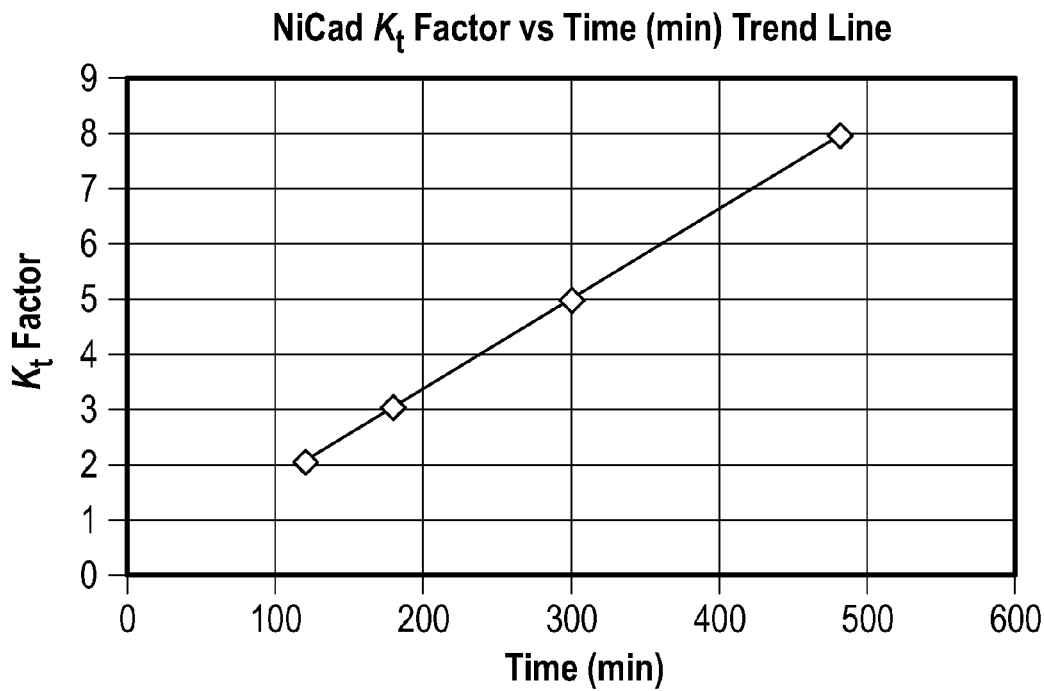

A capacity factor $K_t$ is typically used to assist in determining proper sizing of batteries for a specific application and is typically determined by dividing the nominal capacity of the battery bank (in Ampere hours) by a discharge performance value $t_n$ (also expressed in units of Ampere hours). Unfortunately, the discharge performance value $t_n$ is a complex, non-linear function of discharge time. Applicants discovered that a relatively linear relationship exists between capacity factor $K_t$ and discharge time in constant resistance capacity tests. FIGS. 11 and 12 show capacity factor $K_t$ plotted against discharge time for the capacity tests performed on the batteries described above in connection with FIGS. 9 and 10, respectively. As shown in FIGS. 11 and 12, the tests performed by the applicants demonstrate a linear relationship between capacity factor $K_t$ and discharge time.

The use of average of current measurements taken at relatively short intervals and the discovery of the linear relationship between capacity factor $K_t$ and discharge time enabled the applicants to develop a process to determine, using the battery monitor 104, a rated constant resistance discharge time t using the results of the constant resistance capacity test and readily-available manufacturer-supplied capacity data for a constant current capacity test. First, an average capacity factor $K_t$ is calculated by dividing the nominal rated capacity $C_n$ of the battery (as provided by the manufacturer) by the average current $I_{(avg)}$ measured during a constant resistance capacity test, such as the test described above. As explained above, the average current $I_{(avg)}$ is calculated by taking the average of a series of current measurements taken during the capacity test.

In most cases, the average capacity factor $K_t$ will fall between two of the capacity factor data points provided by the manufacturer (e.g., $K_{t1}$ and $K_{t2}$). Accordingly, in order to provide a more accurate rated constant resistance discharge time t, a linear interpolation is performed accordingly to Equation 6.

$$t = t_1 + \frac{(t_2 - t_1)(K_t - K_{t1})}{(K_{t2} - K_{t1})} \tag{6}$$

In Equation 7, $t_1$ is the discharge time associated with $K_{t1}$ and $t_2$ is the discharge time associated with $K_{t2}$.

A percentage of nominal capacity C can be calculated by dividing the actual time to end voltage $TD_2$ for the constant resistance capacity test by the product of the rated constant resistance discharge time t multiplied by a temperature correction factor $T_{cf}$, then multiplying by 100. This calculation is also shown in Equation 7.

$$C = \frac{TD_2}{t \times T_{cf}} \times 100 \tag{7}$$

The capacity calculation data is preferably stored and used on a graph so that a user can review it for trends.

Capacity Test Example

The following is an example the process for determining the percentage of nominal capacity for VLA battery using a 4 hour discharge constant resistance capacity test. The nominal capacity of the battery bank is 104 Ah. The average current $I_{(avg)}$ during the test was 20.7 Amps, the actual time to end voltage $TD_2$ was 267.15 minutes, and the temperature correction factor $T_{cf}$ was 0.975. Accordingly, the average capacity factor $K_t$ can be calculated: 104 Ah/20.7A=5.024. In this example, the average capacity factor $K_t$ falls between manufacturer-provided capacity factors for 4 and 5 hour discharges.

$K_{t1}$=104 $Ah$/22=4.727 at $t_1$=4 hour $K_{t2}$=104 $Ah$/18=5.778 at $t_2$=5 hour Accordingly, a linear interpolation is used to determine the rated discharge time t, in accordance with Equation 6 above:

$$t = 4 \text{ hours} + \frac{(5 \text{ hours} - 4 \text{ hours}) \times (5.024 - 4.727)}{(5.778 - 4.727)}$$

$$= 4.28 \text{ hours (256.8 minutes)}$$

Once the rated discharge time t has been established, the percentage of nominal capacity C can be calculated from Equation 7.

$$C = \frac{267.15}{256.8 \times 0.975} \times 100 = 106.7\%$$

In order to demonstrate the close correlation between the percentage of nominal capacity determined above using a constant resistance capacity test and a percentage of nominal capacity determined using a constant current capacity test, applicants performed a constant current capacity test on the same battery. In the constant current capacity test, the manufacturer-supplied current load for a 4 hour (240 minute) test was 22 Amps, the temperature correction factor was 1.00, and the actual time to end of the discharge test was 247.0 minutes. Accordingly, the percentage of rated capacity was 247.0/(240×1.00)=102.9%, a difference of 3.8% from the percentage of nominal capacity calculated under the constant resistance capacity test.

The components of the system 100 that are used to conduct the above-described time-adjusted capacity test should be appropriately sized. The main contactor K1 is preferably sized to be equal to or greater than the DC bus fuse size plus the current limit of the battery charger 106. The first load contactor K3 is preferably sized to be equal to or greater than the maximum test box load. The rectifiers SCR-1 and SCR-2, are preferably sized to be equal to or greater than the battery fuse size. The fail-safe circuit 116 provides the same functionality as is provided during float current testing. The first load resistor R3 is preferably sized to a custom size, typically the 8-hour rate of the battery bank 108. The battery shunt R1 is preferably sized to the battery fuse size.

Optionally, an auxiliary remote battery sense circuit 168 could be used to monitor battery voltage during the capacity test. The auxiliary remote battery sense circuit 168 includes a set of leads 166, 167 that connect in very close proximity to the battery bank 108. The auxiliary remote battery sense circuit 168 could be desirable if there is a significant voltage drop on either of the load legs between the battery and the remote sense leads associated with contactors K2a, K2b, as it can provide a more accurate battery voltage measurement for the capacity test.

Ground Fault Monitoring

A ground fault is a location within the DC system 100 that begins to pass current to ground. The voltage of the ground fault does not reflect its severity, only the occurrence of a ground fault. A ground fault can occur for many different reasons and it can often be challenging to find the exact location of the ground fault occurrence. Failing capacitors, faulty wire insulation, battery acid leakage or spillage, and even ground fault circuits themselves can cause a ground fault alarm.

Figure 14:
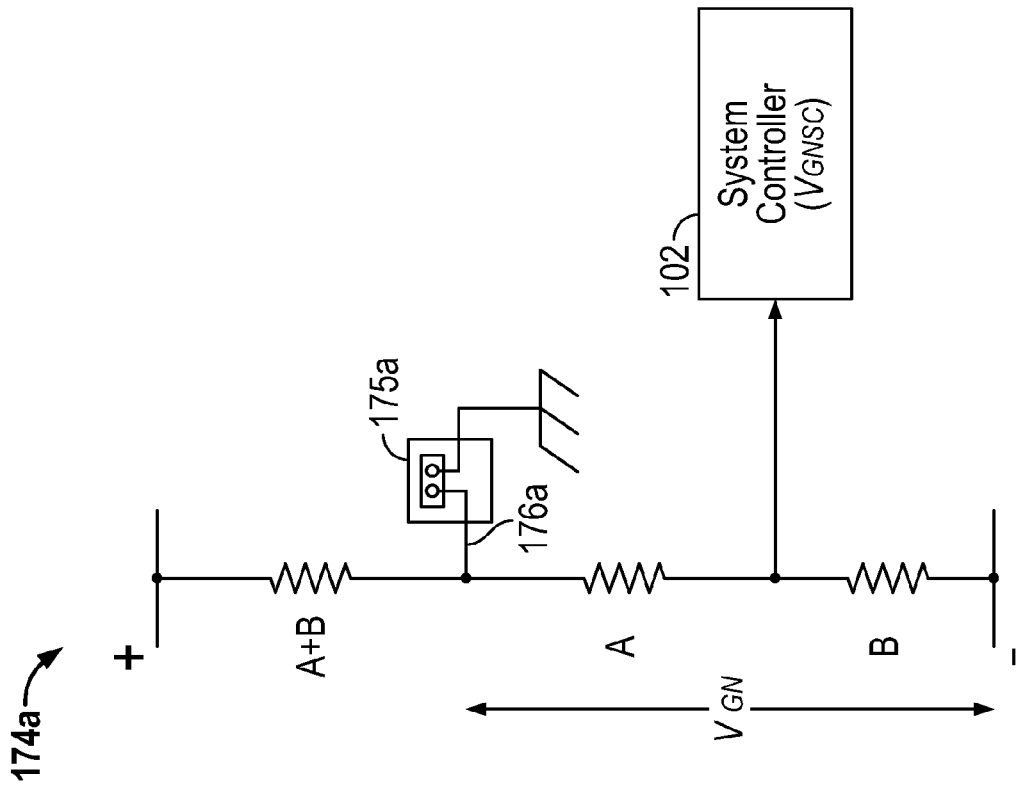
FIGS. 13 and 14 show schematic diagrams of a first exemplary embodiment of ground fault tester circuit of the system of FIG. 1.
Figure 13:
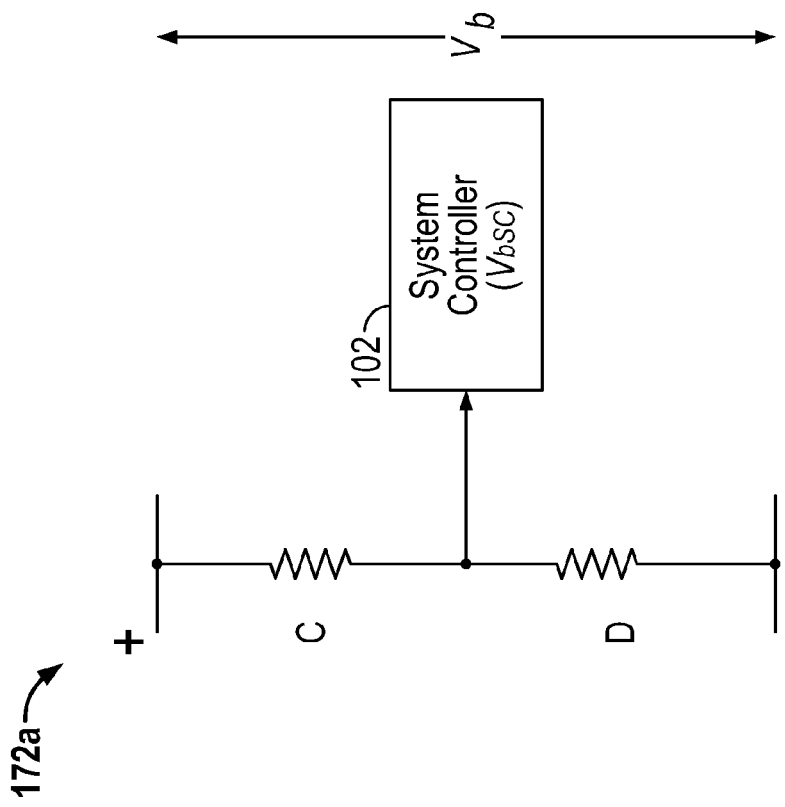

FIGS. 13 and 14 show schematic diagrams of a first exemplary embodiment of a ground fault circuit 170 that is used to test for a ground fault condition. The ground fault circuit 170 comprises a voltage divider circuit 172a (shown in FIG. 13) and a ground detect circuit 174a (shown in FIG. 14). A description of exemplary steps for performing a ground fault test employing the ground fault circuit 170 of this embodiment is provided below. Table 4 identifies acronyms used in Equations 8-13 set forth below.

TABLE 4

| $V_b$ | DC bus voltage | GSF | Battery circuit to ground circuit scaling factor |
|---|---|---|---|
| $V_{bA}$ | Calculated voltage addition from battery | $V_G$ | Adjusted Voltage in ground Circuit |
| $V_{GN}$ | Ground to negative bus voltage | $G_f$ | Ground fault voltage imbalance |
| $G_{FR}$ | Ground fault impedance | $V_{GNSC}$ | Ground to negative system controller voltage |
| $V_{bSC}$ | Voltage of system controller | A | Resistor - Provides A ohms of resistance |
| B | Resistor - Provides B ohms of resistance | C | Resistor - Provides C ohms of resistance |
| D | Resistor - Provides D ohms of resistance | | |

The battery monitor 104 measures for a ground fault at the battery connection terminals TB1-1, TB1-2 of the battery monitor 104. The ground fault will create a loop between ground and a leg of the system 100. Using the circuits 172a, 174a, shown in FIGS. 13 and 14, the ground fault voltage imbalance ($G_f$) and ground fault impedance ($G_{FR}$) can be determined via the calculations set forth below.

The voltage divider circuit 172a is first used to measure the DC bus voltage ($V_b$), via Equation 8 below.

$$V_b = (C+D)/D * V_{bSC} \qquad (8)$$

Next, the ground to negative bus voltage ($V_{GN}$) is measured using the ground detect circuit 174a, shown in FIG. 14. The resistor A+B from ground to the positive bus is included to balance the resistors A and B that are connected from ground to the negative bus, so as not to create an imbalance caused by the measurement circuit 176. A jumper 175 is included so that the ground detect circuit 174a can be disconnected from the system 100. The ground to negative bus voltage ($V_{GN}$) is determined according to Equation 9 below.

$$V_{GN} = (A+B)/B * V_{GNSC} \qquad (9)$$

The ground fault voltage imbalance ($G_f$) is then calculated using Equation 10 below:

$$G_f = V_b/2 - V_{GNSC} \qquad (10)$$

A negative value for $G_f$ will indicate a positive ground fault, and a positive value for $G_f$ will indicate a negative ground fault. The magnitude of $G_f$ will be larger for a lower impedance ground fault.

With the ground fault imbalance ($G_f$) calculated, the ground fault impedance ($G_{FR}$) can also be calculated according to the appropriate one of Equations 11-13 below:

$$\text{If } G_f > 0, \; G_{FR} = (A+B)/((V_b/V_{GN})-2) \qquad (11)$$

$$\text{If } G_f = 0, \; G_{FR} = \text{infinity} \qquad (12)$$

$$\text{If } G_f < 0, \; G_{FR} = (A+B)*(-1/((V_b/V_{GN})-2)-1) \qquad (13)$$

A second exemplary embodiment of the ground fault circuit 170 is shown in

Figure 16:
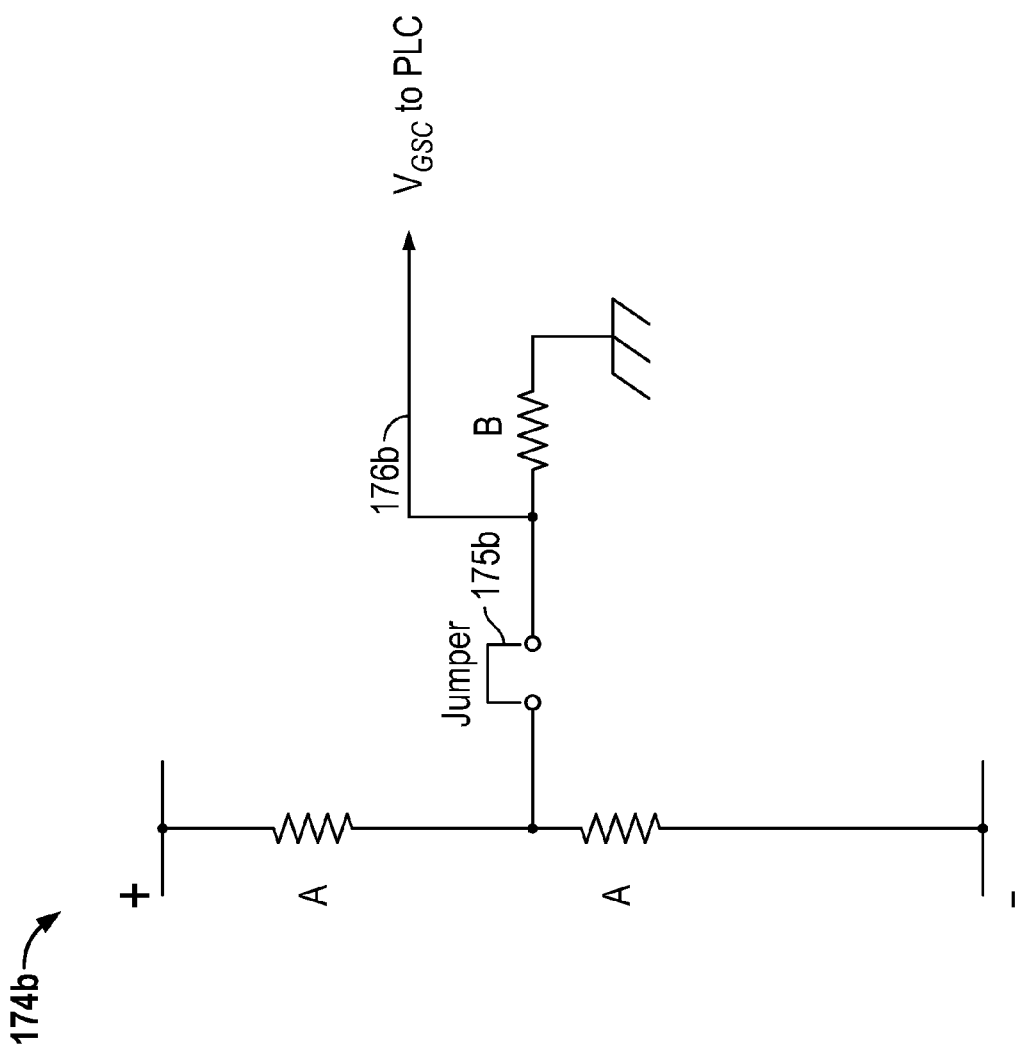
FIGS. 15 and 16 show schematic diagrams of a first exemplary embodiment of ground fault tester circuit of the system of FIG. 1.
Figure 15:
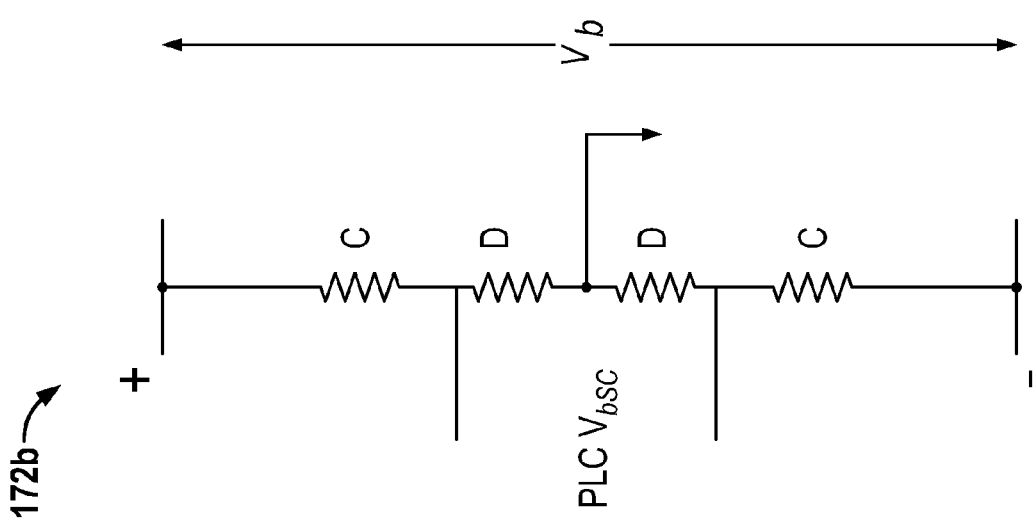

FIGS. 15 and 16, which show a different voltage divider circuit 172b (shown in FIG. 15) and an alternative ground detect circuit 174b (shown in FIG. 15). In this embodiment, DC bus voltage, as measured by the voltage divider circuit 172b, is determined according to Equation 14.

$$V_b = ((C+D)/D) * V_{bSC} \qquad (14)$$

The ground fault voltage imbalance ($G_f$) is measured using voltage divider circuit 174b. A resistor A from ground to the positive bus is included to balance second resistor A that is connected from ground to the negative bus, so as not to create an imbalance caused by the measurement circuit 176b. The ground fault voltage imbalance is determined by Equation 15.

$$G_f = (((A/2)+B)/B) * V_{gSC} \qquad (15)$$

A negative value for $G_f$ will indicate a positive ground fault, and a positive value for $G_f$ will indicate a negative ground fault. The magnitude of $G_f$ will be larger for a lower impedance ground fault. The positive and negative bus to ground voltages can be calculated according to Equations 16 and 17:

$$V_{GN} = V_b/2 - G_f \qquad (16)$$

$$V_{GP} = V_b/2 + G_f \qquad (17)$$

The impedance of the ground fault ($G_{Fr}$) can be calculated using Equations 18-20.

$$\text{If } G_f > 0 \text{ then } G_{Fr} = (V_{GN}*(B))/V_{gSC} \text{ (Negative fault)} \quad (18)$$

$$\text{If } G_f = 0 \text{ then } G_{Fr} = \text{infinity} \quad (19)$$

$$\text{If } G_f < 0 \text{ then } G_{Fr} = (V_{GP}*(-B))/V_{gSC} \text{ (Positive fault)} \quad (20)$$

A jumper 175b is included as a means of disconnecting the ground fault measurement circuit from the DC system 100.

Thus, as described herein, described embodiments provide an integrated monitoring system 100 to monitor the status of the direct current (DC) subsystem of a utility substation. In particular, described embodiments provide a system that aggregates data from one or more modules within the DC subsystem and reports the aggregated data to one or more remote devices. For example, the modules might include a battery charger 106 of the DC subsystem, the batteries 109a-109i of the DC subsystem, relays of the DC subsystem, and other peripheral systems, such as heating, cooling, ventilation, or other peripheral systems. The integrated monitoring system 100 might aggregate data from each module into a single indication of overall system status. The aggregated system status might be displayed locally on a user interface 120 of the integrated monitoring system 100, for example a simple status indication light indicating that the system status is operational, that the system 100 has one or more warnings, or that the system 100 has one or more critical issues (e.g., a green indicator lamp and a red indicator lamp). Further, the aggregated system status might also be reported to one or more remote locations or remote devices 112 via a communication link 114. Further, integrated monitoring system 100 might report the data collected from each of the modules within the DC subsystem to the remote location for monitoring and analysis, and this detailed data might also be displayed locally on a user interface 120 of the integrated monitoring system. The detailed status data might show, for example, detailed data of each module of the DC subsystem, plus any warnings or errors, and also suggested solutions for any warnings or errors. For example, the detailed status might be displayed on an LCD screen, computer monitor, or touchscreen of the integrated monitoring system 100. Thus, described embodiments provide an improved monitoring and reporting system for DC subsystems of utility substations.

It will be further understood that various changes in the details, materials, and arrangements of the parts that have been described and illustrated in order to explain the nature of the described embodiments might be made by those skilled in the art without departing from the scope expressed in the following claims.

The invention claimed is:

1. An apparatus for testing a battery bank comprising at least one battery, the battery bank being part of a load circuit in which the battery bank, a charger, and a system load are arranged in parallel, the apparatus comprising:
   a controller;
   a main contactor located on a first leg of the load circuit between the battery bank and the charger, so that the battery bank is electrically disconnected from the charger when the main contactor is open and the battery bank is electrically connected to the charger when the main contactor is closed, the first leg of the load circuit having a battery side extending between the main contactor and the battery bank and a system load;
   a float current test circuit connected to the first leg in parallel with the main contactor and having a float current contactor located thereon configured to electrically open and close the float current test circuit;
   a first voltage sensor having a first connection point that is in electrical contact with the the first leg; and
   a fail-safe circuit connected to the first leg in parallel with the main contactor and the float current test circuit, the fail-safe circuit having a first fail-safe device, a second fail-safe device, a first end and an opposite second end, so that the first and second ends are electrically connected to the first leg and to each of the first and second fail-safe devices, each of the first and second fail-safe devices having an active mode in which electrical current is permitted to flow in a forward direction through the fail-safe device and electrical current is prevented from flowing in a backward direction through the fail-safe device and an inactive mode in which electrical current is prevented from flowing in both the forward and backward directions through the fail-safe device, each of the fail-safe devices being operationally configured to change between active and inactive modes based on a mode signal, the first fail-safe device and the second fail-safe device being installed in the fail-safe circuit in opposite orientations, so that the forward direction of the first fail-safe device corresponds to the backward direction of the second fail-safe device;
   wherein the controller is electrically connected to the main contactor, the float current contactor, the first fail-safe device, and the second fail-safe device and the controller is operationally configured to (a) close the float current contactor when the main contactor is open, (b) open the float current contactor when the main contactor is closed, and (c) cause the first and second fail-safe devices to enter active mode if the controller detects a failure of the main contactor.

2. The apparatus of claim 1, wherein the first and second fail-safe devices each comprise a semiconductor-controlled rectifier.

3. The apparatus of claim 1, wherein the float current test circuit includes first and second end points in electrical contact with the first leg at a first connection point that is located between the main contactor and the battery bank and a second connection point located between the main contactor and the system load.

4. The apparatus of claim 1, wherein the first leg is a negative leg of the load circuit.

5. The apparatus of claim 1, wherein the float current test circuit comprises a shunt, the float current contactor, and a fuse arranged in series.

6. The apparatus of claim 5, wherein the float current circuit further comprises a diode arranged in series with the shunt, the float current contactor, and the fuse.

7. The apparatus of claim 5, wherein the fuse comprises a resettable fuse.

8. An apparatus for testing a battery bank comprising at least one battery, the battery bank being part of a load circuit in which the battery bank, a charger, and a system load are arranged in parallel, the apparatus comprising:
   a controller;
   a main contactor located on a first leg of the load circuit between the battery bank and the charger, so that the battery bank is electrically disconnected from the charger when the main contactor is open and the battery bank is electrically connected to the charger when the main contactor is closed, the first leg of the load circuit having a battery side extending between the main contactor and the battery bank and a system load;

a float current test circuit connected to the first leg in parallel with the main contactor, the float current test circuit comprising a shunt, a float current contactor, and a fuse arranged in series;

a first voltage sensor having a first connection point that is in electrical contact with the first leg; and a fail-safe circuit having first and second ends electrically connected to the first leg and arranged in parallel with the main contactor, the fail-safe circuit having an active mode in which electrical current can flow in at least one direction through the fail-safe circuit and an inactive mode in which the fail-safe circuit is open, which prevents electrical current from flowing in either direction through the fail-safe circuit;

wherein the controller is electrically connected to the main contactor, the float current contactor, the first fail-safe circuit and the controller is operationally configured to (a) close the float current contactor when the main contactor is open, (b) open the float current contactor when the main contactor is closed, and (c) cause the fail-safe circuit to enter active mode if the controller detects a failure of the main contactor.

9. An apparatus for testing a battery bank comprising at least one battery, the battery bank being part of a load circuit in which the battery bank, a charger, and a system load are arranged in parallel, the apparatus comprising:

a controller;

a main contactor located on a first leg of the load circuit between the battery bank and the charger, so that the battery bank is electrically disconnected from the charger when the main contactor is open and the battery bank is electrically connected to the charger when the main contactor is closed, the first leg of the load circuit having a battery side extending between the main contactor and the battery bank and a system load;

a float current test circuit connected to the first leg in parallel with the main contactor and having a float current contactor located thereon configured to electrically open and close the float current test circuit;

a first voltage sensor having a first connection point that is in electrical contact with the battery side of the first leg and a second connection point in electrical contact with the system load side of the first leg;

a remote sense contactor in electrical contact with the first voltage sensor, the remote sense contactor operationally configured to selectively electrically connect the first voltage sensor to one of the first connection point and the second connection point;

a fail-safe circuit having first and second ends electrically connected to the first leg and arranged in parallel with the main contactor, the fail-safe circuit having an active mode in which electrical current can flow in at least one direction through the fail-safe circuit and an inactive mode in which the fail-safe circuit is open, which prevents electrical current from flowing in either direction through the fail-safe circuit; and wherein the controller is electrically connected to the main contactor, the float current contactor, the fail-safe circuit, and the controller is operationally configured to (a) close the float current contactor, cause the remote sense contactor to connect the first voltage sensor to the first connection point when the main contactor is open and (b) open the float current contactor, cause the remote sense contactor to connect the first voltage sensor to the second connection point when the main contactor is closed.

* * * * *